US012749513B2

(12) United States Patent
Song

(10) Patent No.: US 12,749,513 B2
(45) Date of Patent: Sep. 29, 2026

(54) PROCESSING-IN-MEMORY(PIM) DEVICE

(71) Applicant: SK hynix Inc., Icheon-si Gyeonggi-do (KR)

(72) Inventor: Choung Ki Song, Yongin-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 987 days.

(21) Appl. No.: 17/989,478

(22) Filed: Nov. 17, 2022

(65) Prior Publication Data

US 2023/0077701 A1 Mar. 16, 2023

Related U.S. Application Data

(63) Continuation-in-part of application No. 17/090,462, filed on Nov. 5, 2020, now Pat. No. 11,537,323.

(60) Provisional application No. 62/958,223, filed on Jan. 7, 2020.

(30) Foreign Application Priority Data

Jan. 17, 2020 (KR) ........................ 10-2020-0006902

(51) Int. Cl.

| | |
|---|---|
| ***G11C 7/10*** | (2006.01) |
| ***G06F 15/78*** | (2006.01) |
| *G06F 7/544* | (2006.01) |

(52) U.S. Cl.
CPC ........ *G11C 7/1006* (2013.01); *G06F 15/7821* (2013.01); *G06F 7/5443* (2013.01)

(58) Field of Classification Search
CPC ..... G11C 7/1006; G11C 11/54; G06F 7/5443; G06F 15/7821; G06F 17/16; G06G 7/16–161
See application file for complete search history.

(56) References Cited

U.S. PATENT DOCUMENTS

| | | | | |
|---|---|---|---|---|
| 10,042,639 | B2 | 8/2018 | Gopal et al. | |
| 2017/0344301 | A1* | 11/2017 | Ryu | G06F 15/785 |
| 2020/0160157 | A1* | 5/2020 | Kim | G06F 7/5443 |
| 2020/0193277 | A1* | 6/2020 | Kwon | G11C 16/26 |
| 2020/0294575 | A1* | 9/2020 | O | G11C 11/4096 |
| 2021/0050040 | A1* | 2/2021 | Ramesh | H03M 7/24 |
| 2022/0028437 | A1* | 1/2022 | Ramesh | G06F 7/50 |

FOREIGN PATENT DOCUMENTS

KR 1020200108772 A 9/2020

* cited by examiner

*Primary Examiner* — Matthew D Sandifer
(74) *Attorney, Agent, or Firm* — WILLIAM PARK AND ASSOCIATES LTD.

(57) ABSTRACT

A processing-in-memory (PIM) device includes a memory circuit, a processing circuit configured to receive arithmetic data from the memory circuit to perform an arithmetic operation, an information storage configured to store arithmetic operation information that defines the arithmetic operation, a processing control circuit configured to generate a first arithmetic control signal and a second arithmetic control signal based on the arithmetic operation information from the information storage and an internal initiation command, and a memory control circuit configured to generate a memory control signal based on the second arithmetic control signal and configured to transmit the memory control signal to the memory circuit.

25 Claims, 38 Drawing Sheets

PROCESSING-IN-MEMORY(PIM) DEVICE

CROSS-REFERENCE TO RELATED APPLICATIONS

This is a continuation-in-part of U.S. patent application Ser. No. 17/090,462, filed on Nov. 5, 2020, which claims the benefit of U.S. Provisional Application No. 62/958,223, filed on Jan. 7, 2020, and claims priority to Korean Application No. 10-2020-0006902, filed on Jan. 17, 2020, in the Korean Intellectual Property Office, which are incorporated herein by reference in their entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One cause of this widespread interest may be due to the improved performance of processors performing arithmetic operations. To improve the performance of artificial intelligence, it may be necessary to increase the number of layers constituting a neural network of the artificial intelligence to educate the artificial intelligence. This trend has continued in recent years, which has led to an exponential increase in the amount of computations required for hardware actually performing the computations. Moreover, if artificial intelligence employs a general hardware system including a memory and a processor which are separated from each other, the performance of the artificial intelligence may be degraded due to a limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

A processing-in-memory (PIM) device according to an embodiment of the present disclosure may include a memory circuit, a processing circuit configured to receive arithmetic data from the memory circuit to perform an arithmetic operation, an information storage configured to store arithmetic operation information that defines the arithmetic operation, a processing control circuit configured to generate a first arithmetic control signal and a second arithmetic control signal based on the arithmetic operation information from the information storage and an internal initiation command, and a memory control circuit configured to generate a memory control signal based on the second arithmetic control signal and configured to transmit the memory control signal to the memory circuit.

BRIEF DESCRIPTION OF THE DRAWINGS

Certain features of the disclosed technology are illustrated by various embodiments with reference to the attached drawings.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
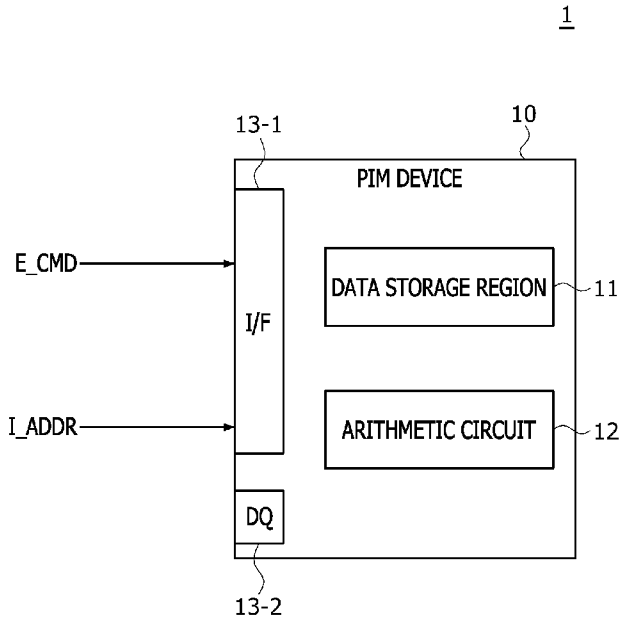
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the PIM device 10 through the data I/O pad 13-2. Also, data outputted from the PIM device 10 may be inputted to the host or the PIM controller through the data I/O pad 13-2.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
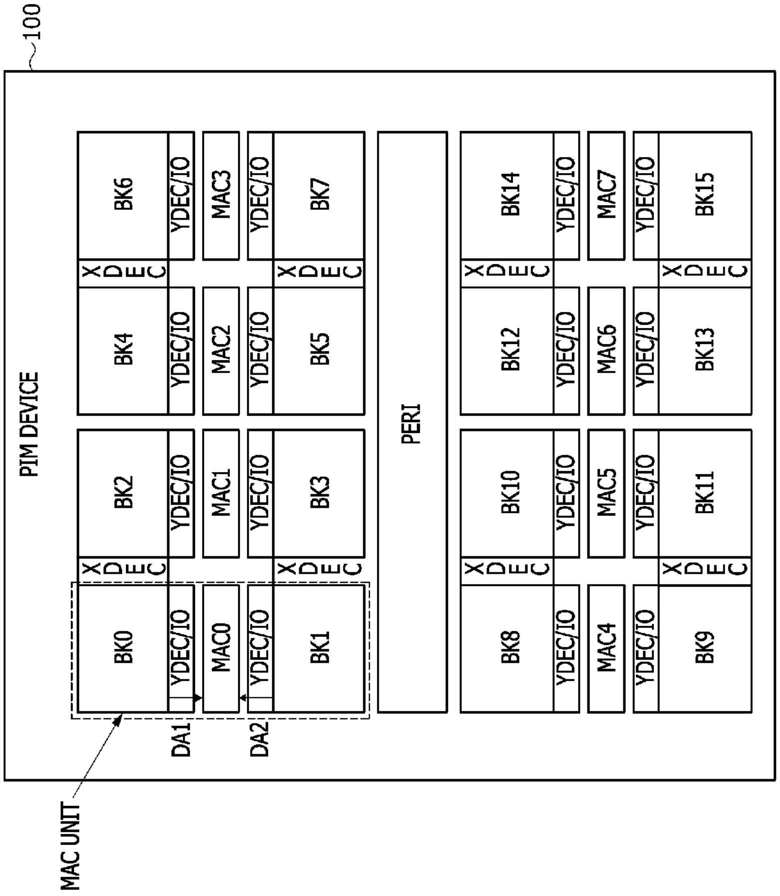
FIG. 2 is a schematic diagram illustrating an arrangement of memory banks and multiplication/accumulation (MAC) operators included in a PIM device according to a first embodiment of the present disclosure.

FIG. 2 illustrates a disposal structure indicating placement of memory banks BK0, . . . , and BK15 and MAC operators MAC0, . . . , and MAC7 included in a PIM device 100 according to an embodiment of the present disclosure. In an embodiment, the memory banks BK0, . . . , and BK15 and the MAC operators MAC0, . . . , and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, . . . , and BK15. Although the present embodiment illustrates an example in which the data storage region includes the memory banks BK0, . . . , and BK15, the memory banks BK0, . . . , and BK15 are merely examples which are suitable for the data storage region. In some embodiments, the memory banks BK0, . . . , and BK15 may be a memory region corresponding to a volatile memory device, for example, a DRAM device. In an embodiment, each of the memory banks BK0, . . . , and BK15 may be a component unit which is independently activated and may be configured to have the same data bus width as data I/O lines in the PIM device 100. In an embodiment, the memory banks BK0, . . . , and BK15 may operate through interleaving such that an active operation of any one of the memory banks is performed in parallel while another memory bank is selected. Although the present embodiment illustrates an example in which the PIM device 100 includes the memory banks BK0, . . . , and BK15, the number of the memory banks is not limited to 16 and may be different in different embodiments. Each of the memory banks BK0, . . . , and BK15 may include at least one cell array which includes memory unit cells located at cross points of a plurality of rows and a plurality of columns. The memory banks BK0, . . . , and BK15 may include a first group of memory banks (e.g., odd-numbered memory banks BK0, BK2, . . . , and BK14) and a second group of memory banks (e.g., even-numbered memory banks BK1, BK3, . . . , and BK15).

A core circuit may be disposed to be adjacent to the memory banks BK0, . . . , and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, . . . , and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, . . . , and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, . . . , and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0~MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . , and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
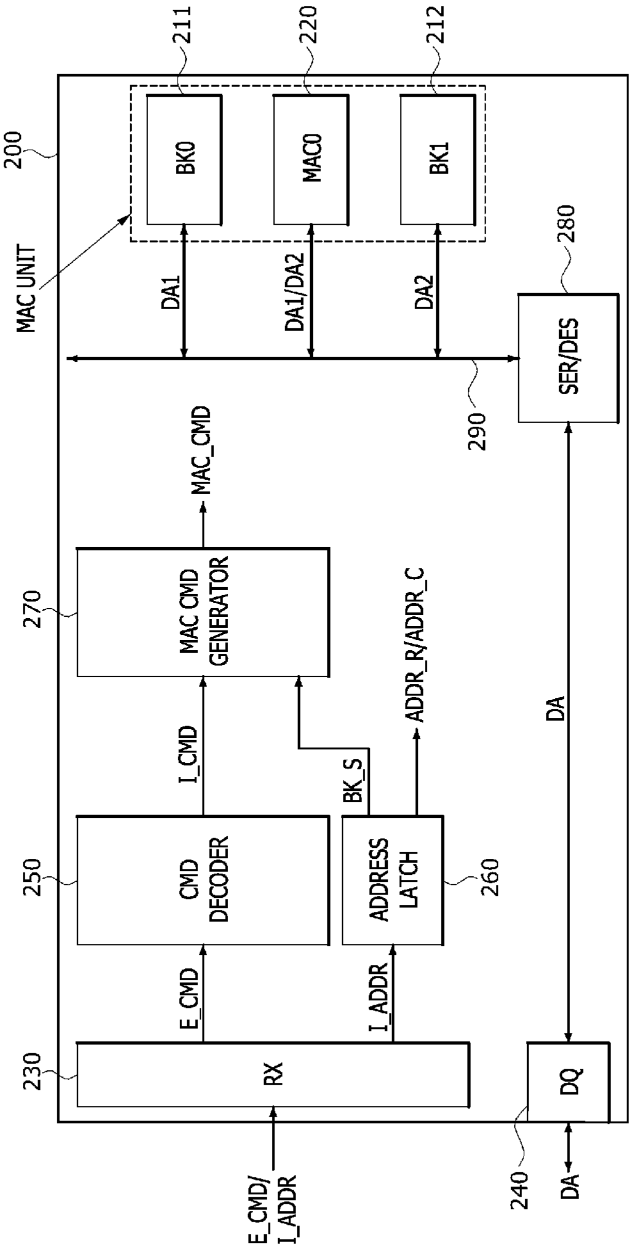
FIG. 3 is a block diagram illustrating a configuration of a PIM device according to the first embodiment of the present disclosure.
Figure 4:
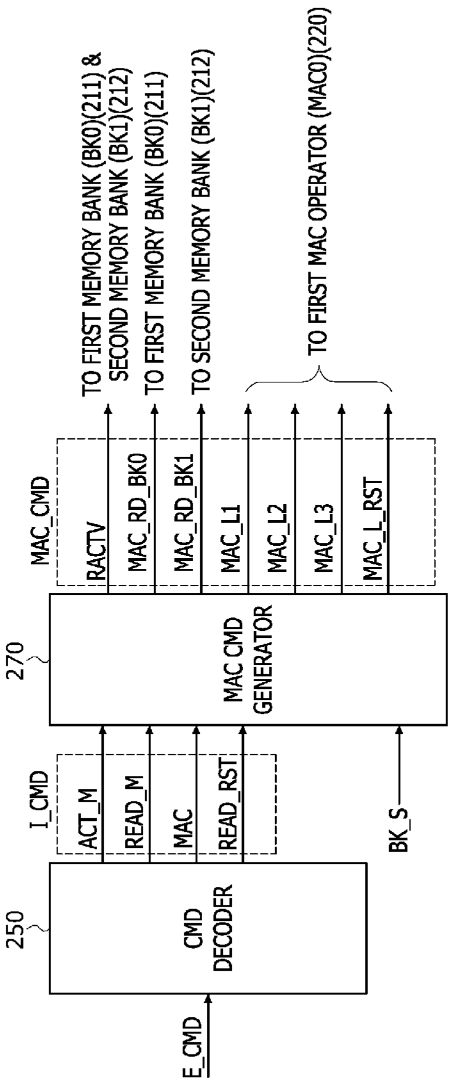
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment, the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC_L3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
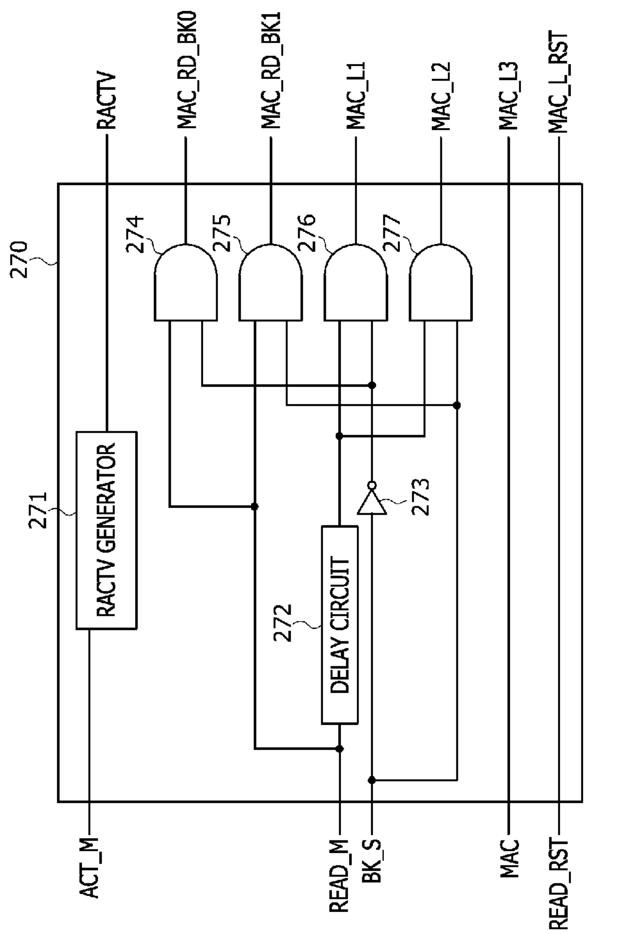
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
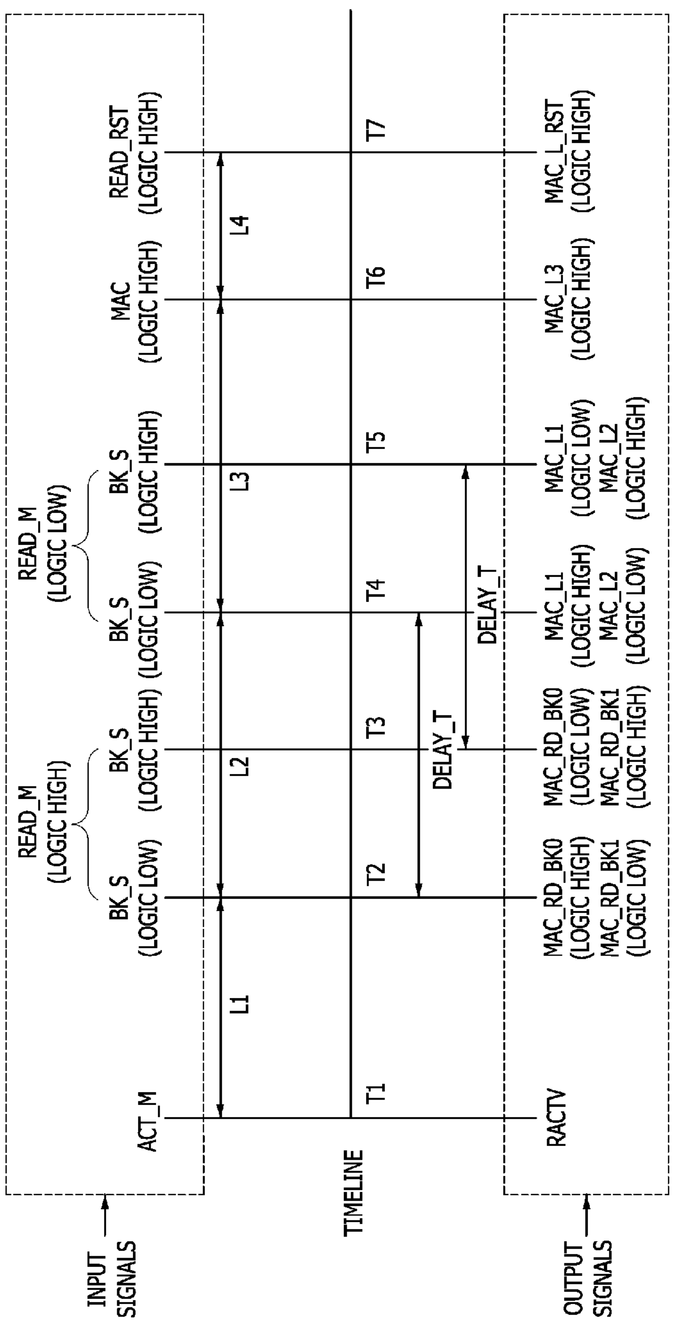
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level. In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M, READ_M, MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3.

Figure 7:
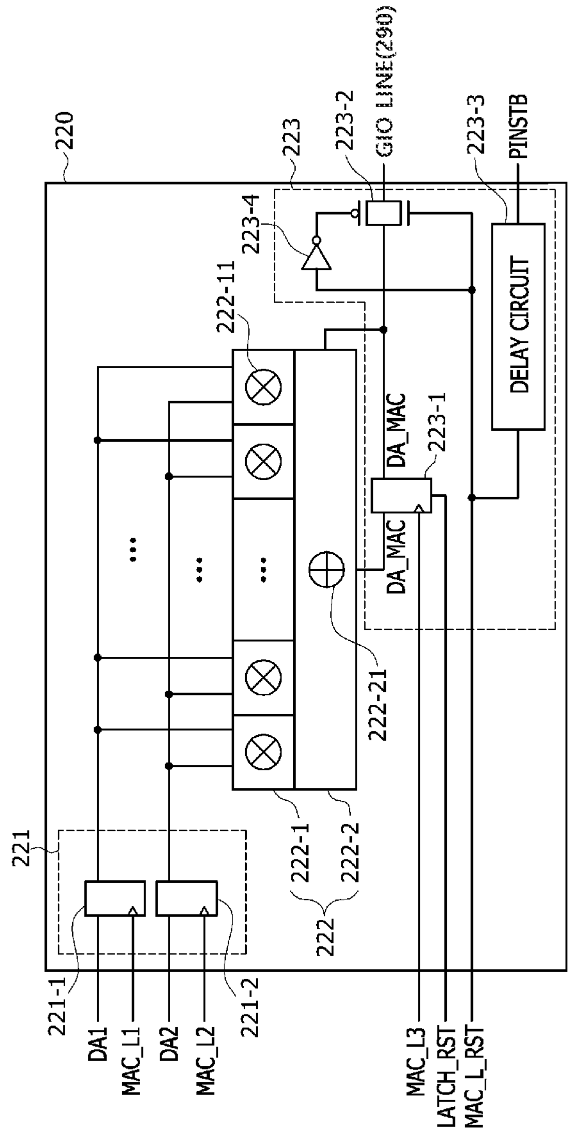
FIG. 7 illustrates an example of a configuration of a MAC operator included in the PIM device of FIG. 3.
Figure 8:
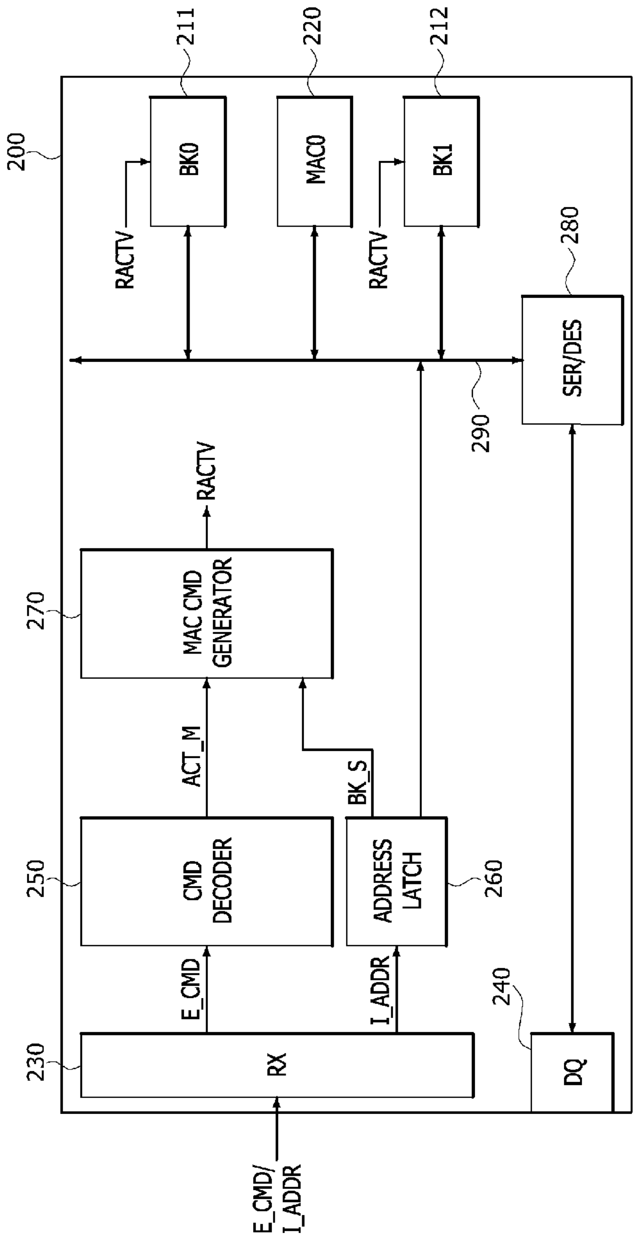
FIGS. 8 to 14 are block diagrams illustrating operations of the PIM device illustrated in FIG. 3.

FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit 222-1 and an addition logic circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the PIM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270.

The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
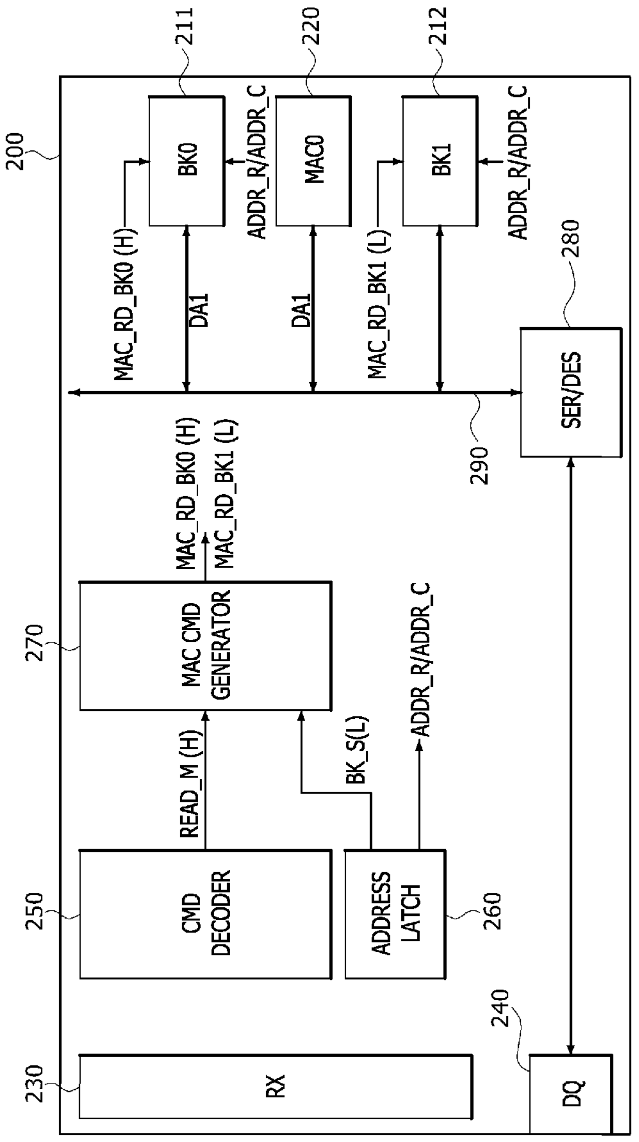

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270. In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
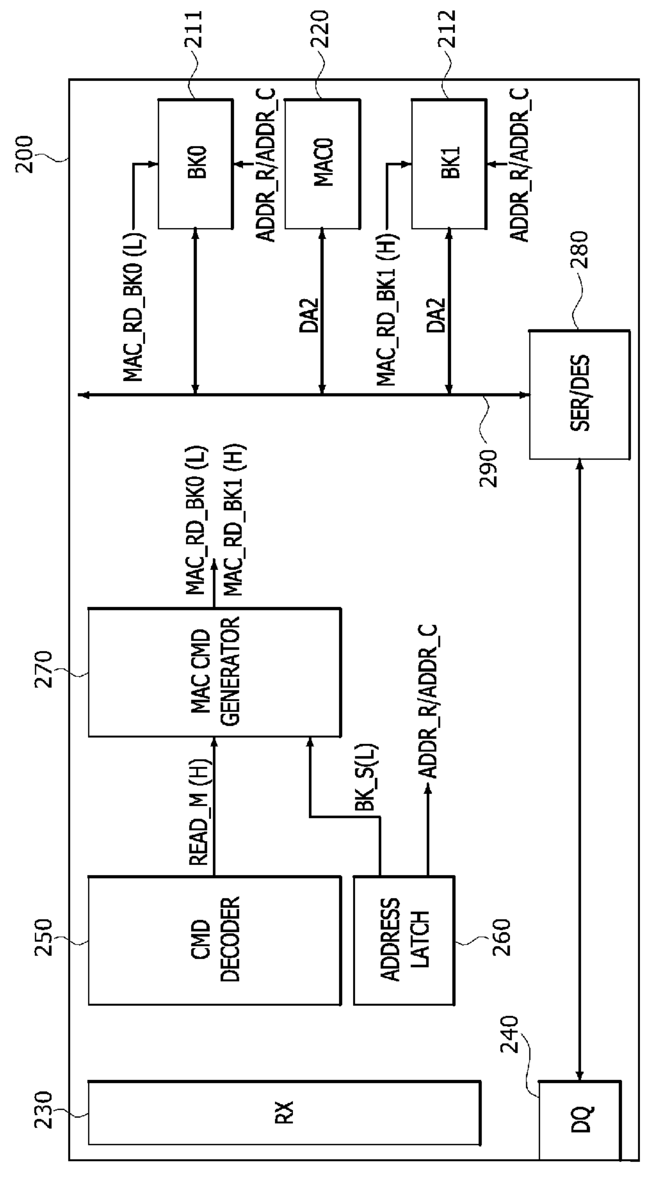

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
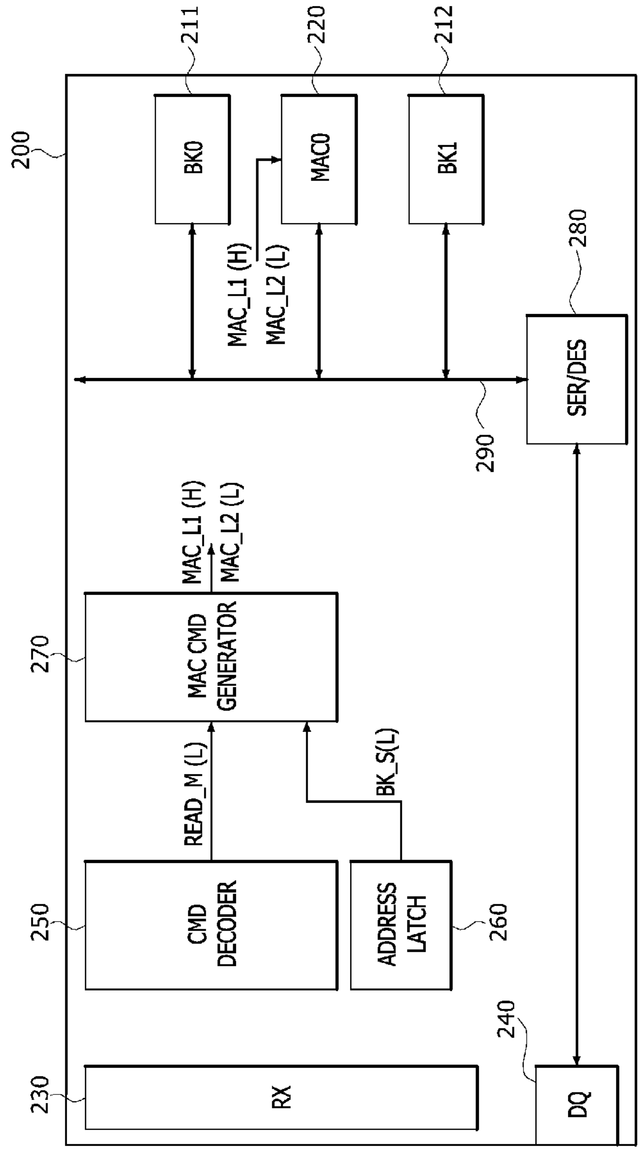

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DA1.

Figure 12:
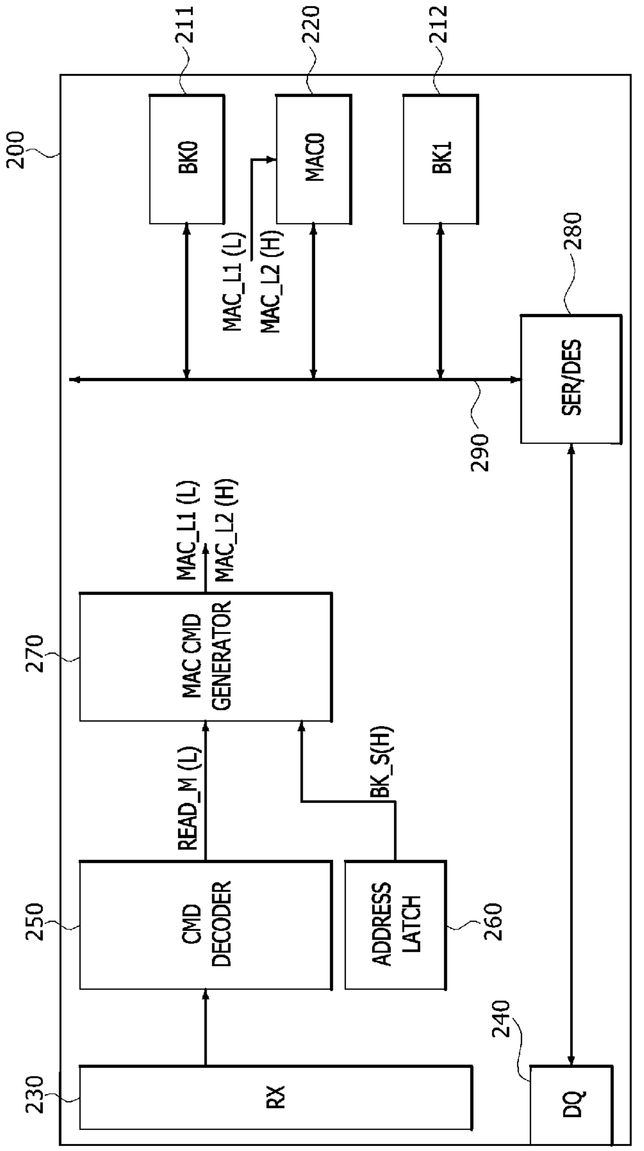

Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
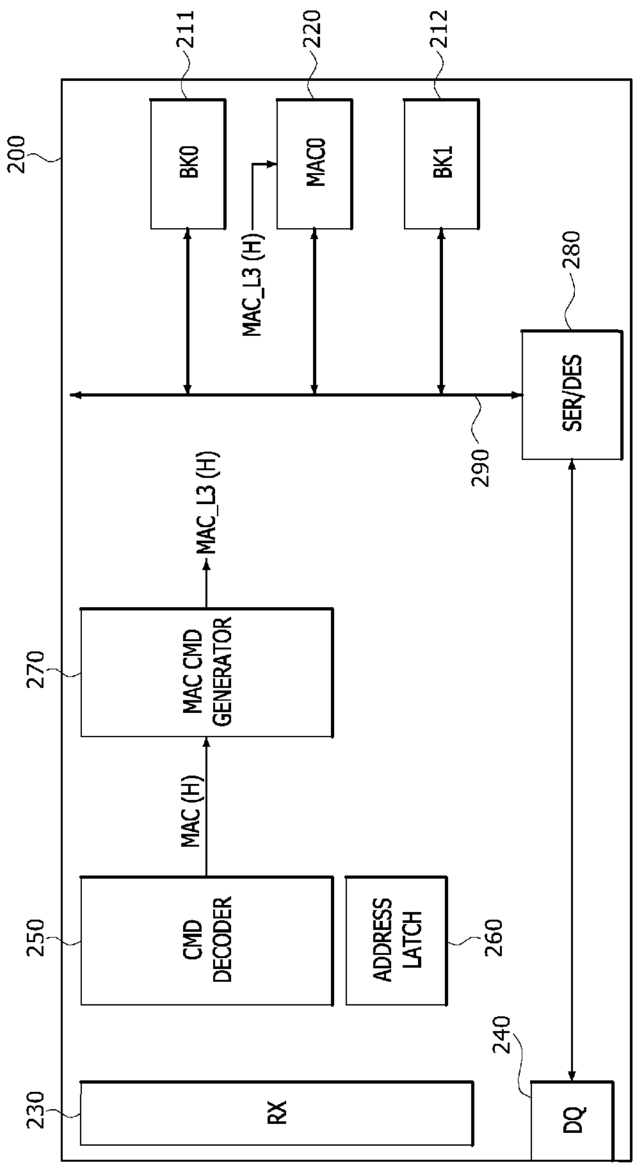

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit (222-2 of FIG. 7) for the accumulative adding calculation.

Figure 14:
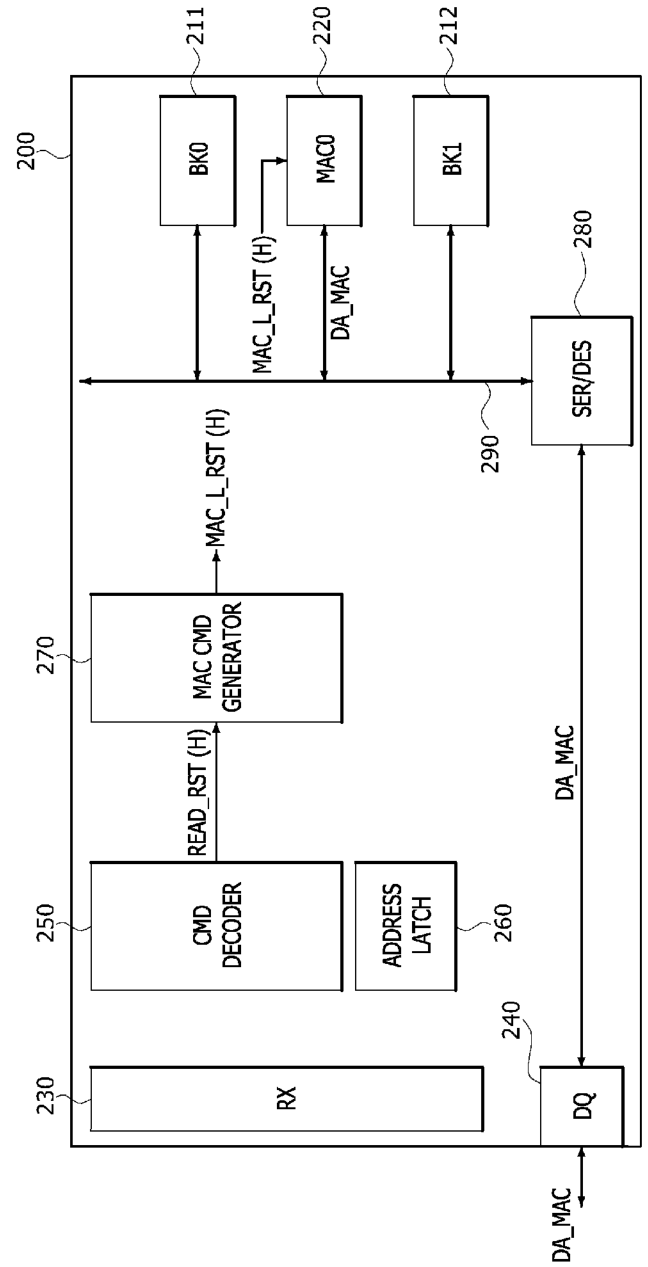

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240.

Figure 15:
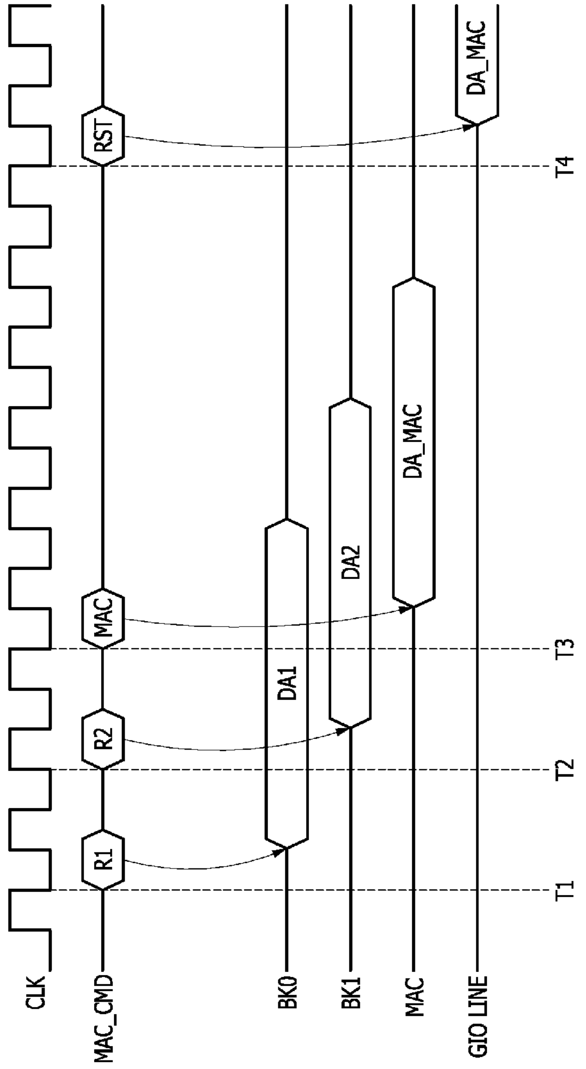
FIG. 15 is a timing diagram illustrating an operation of the PIM device illustrated in FIG. 3.

FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the clock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
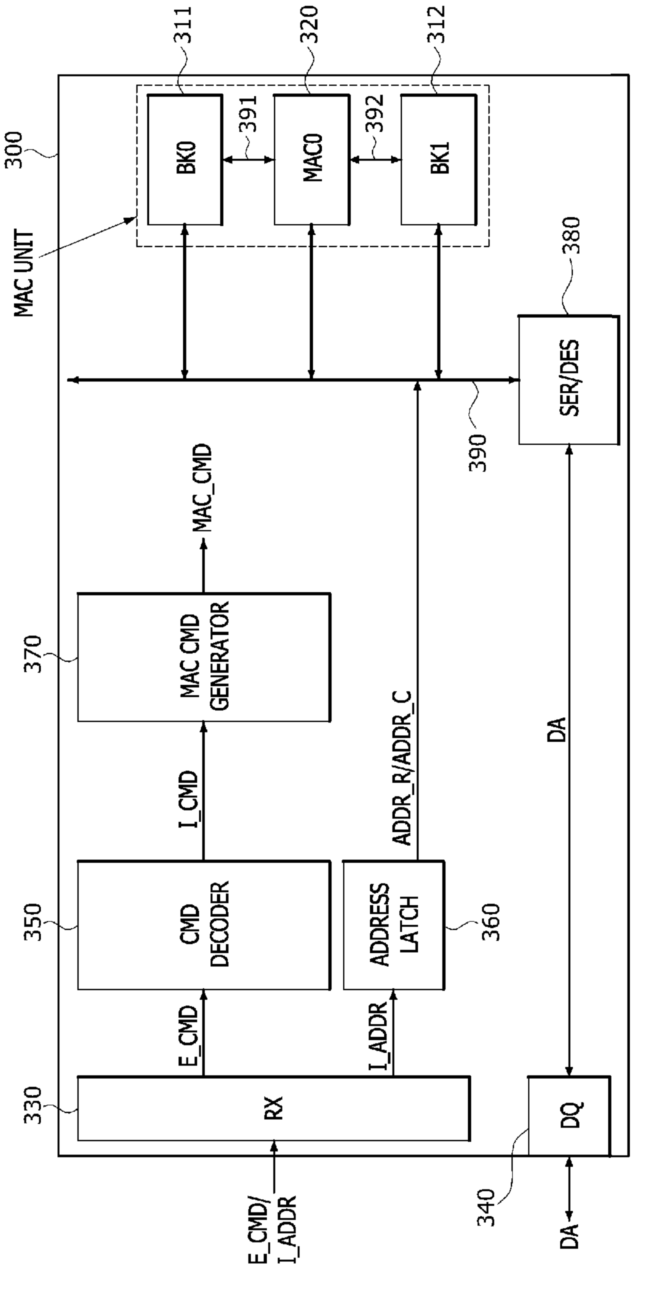
FIG. 16 is a block diagram illustrating another configuration of a PIM device according to the first embodiment of the present disclosure.
Figure 17:
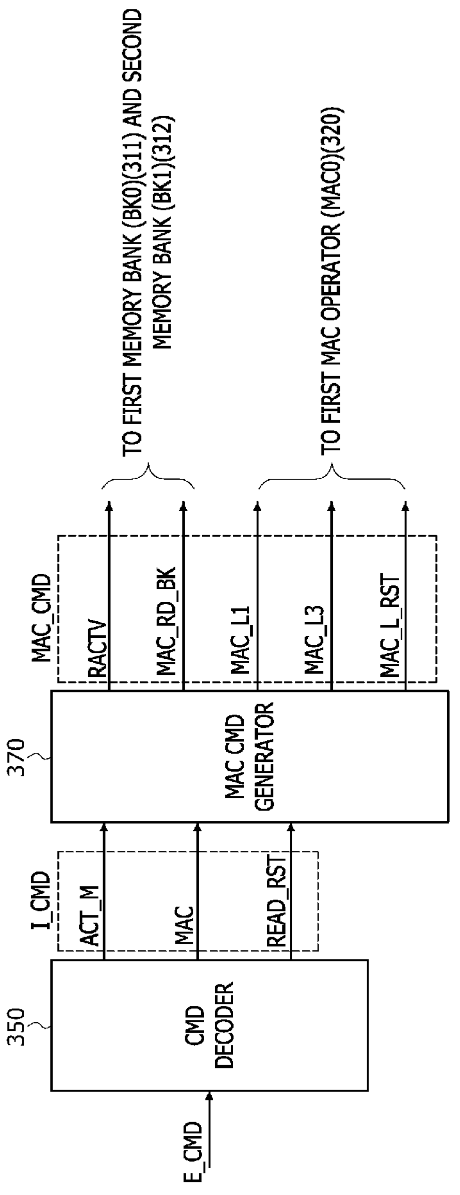
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal I_CMD outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with an data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_L1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
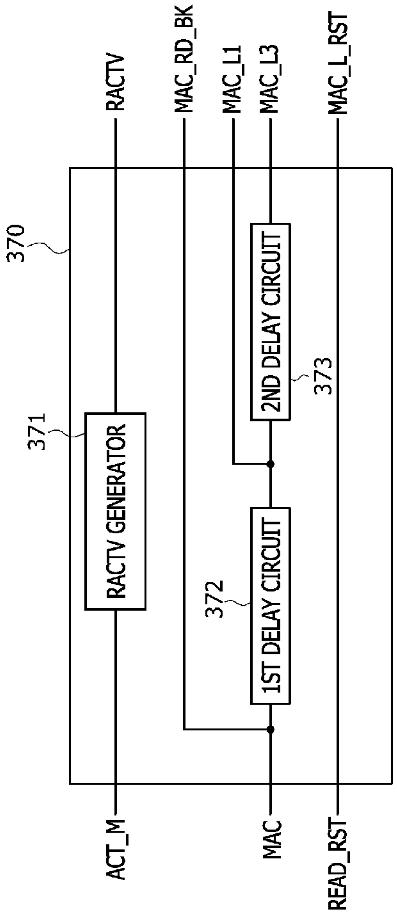
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_L1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
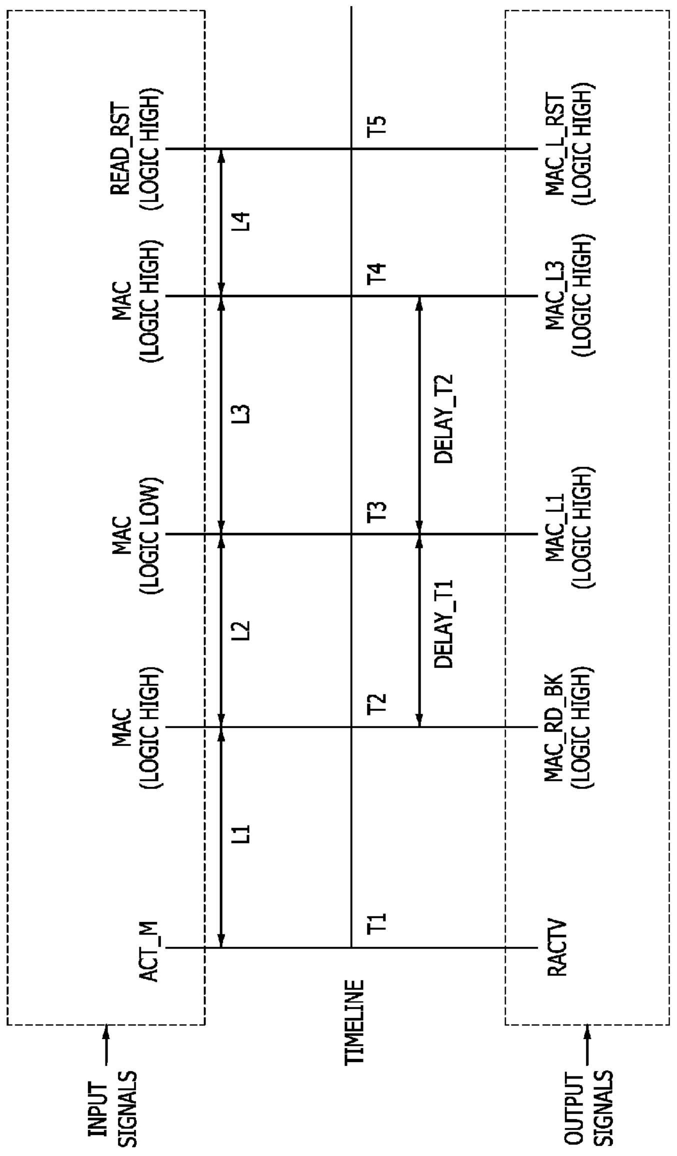
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
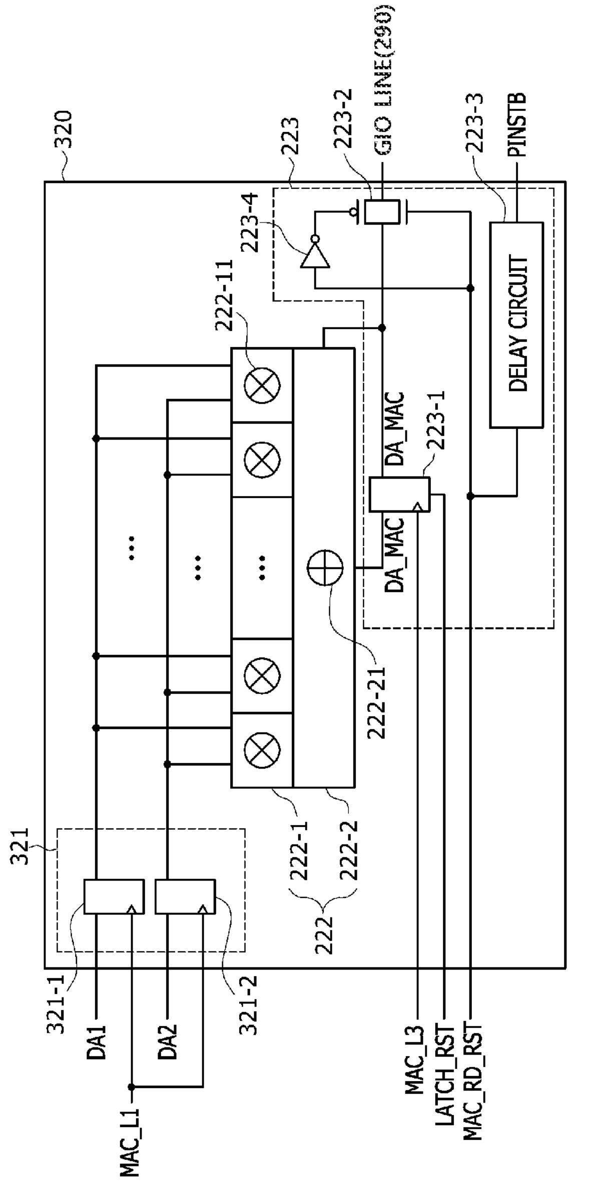
FIG. 20 illustrates an example of a configuration of a MAC operator included in the PIM device of FIG. 16.
Figure 21:
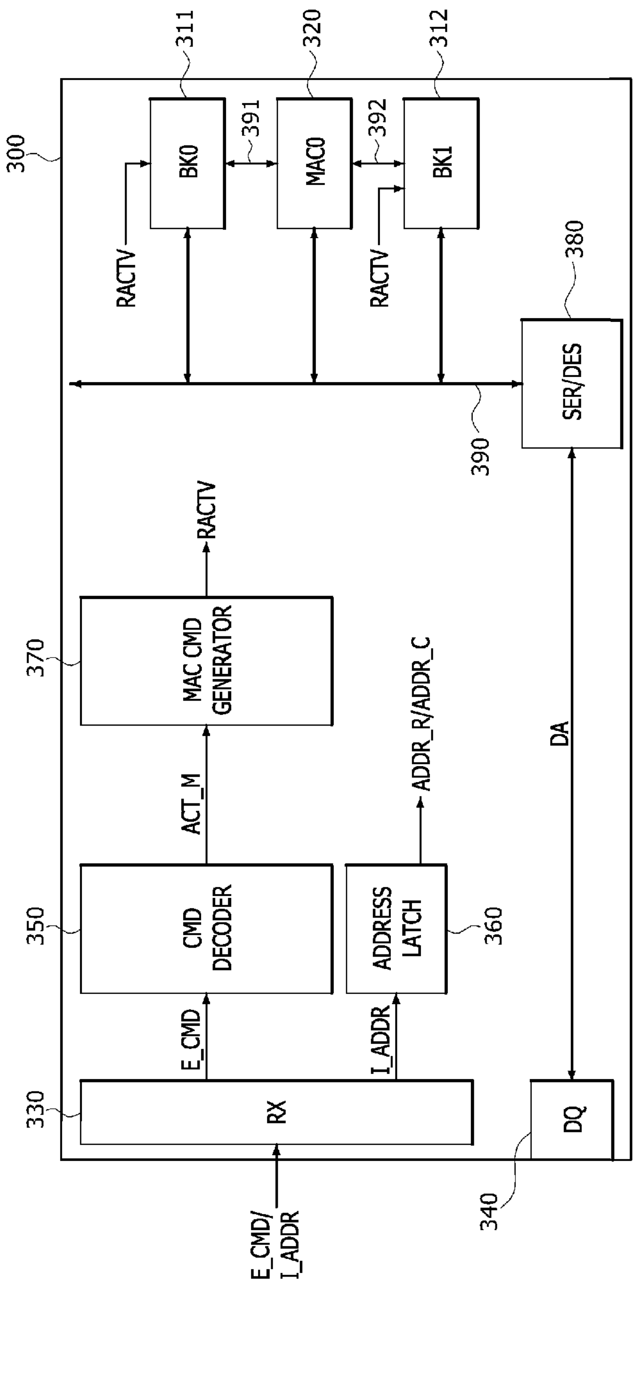
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to clock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
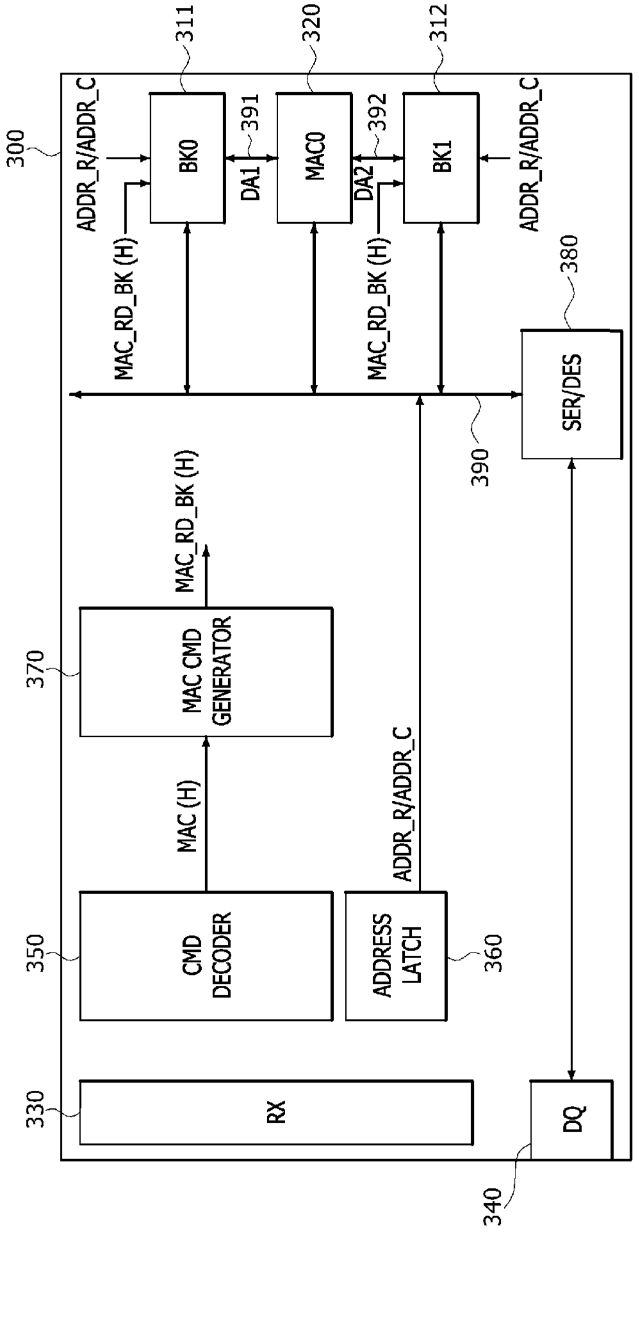

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
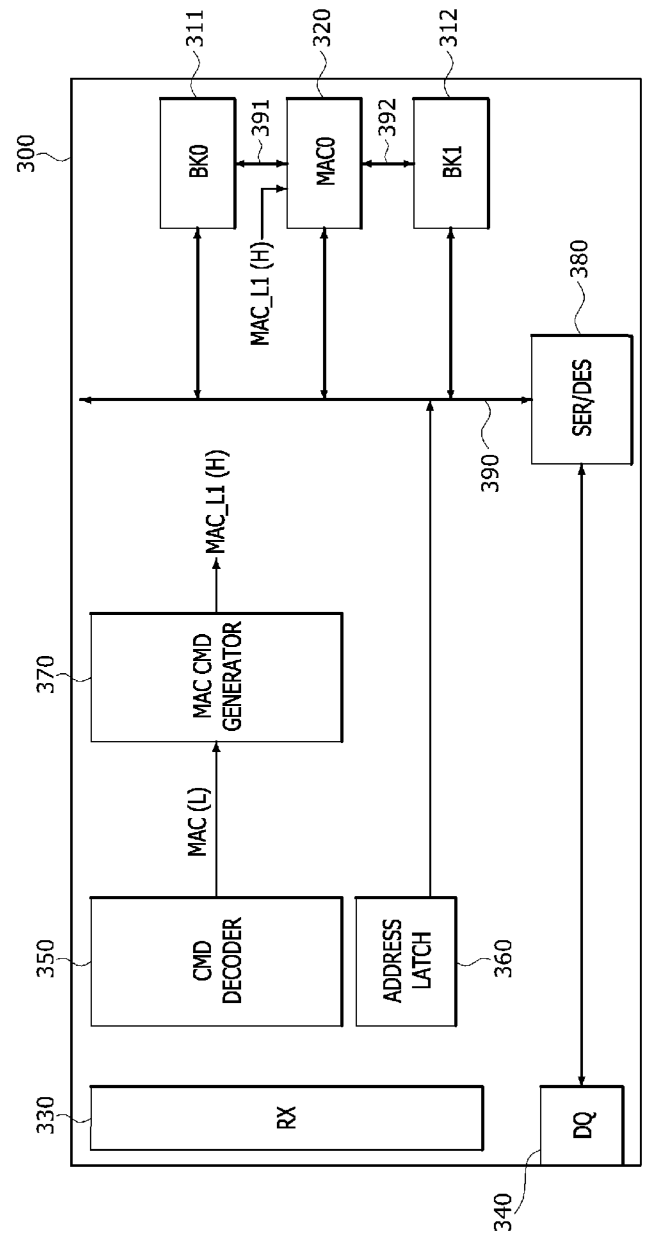

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
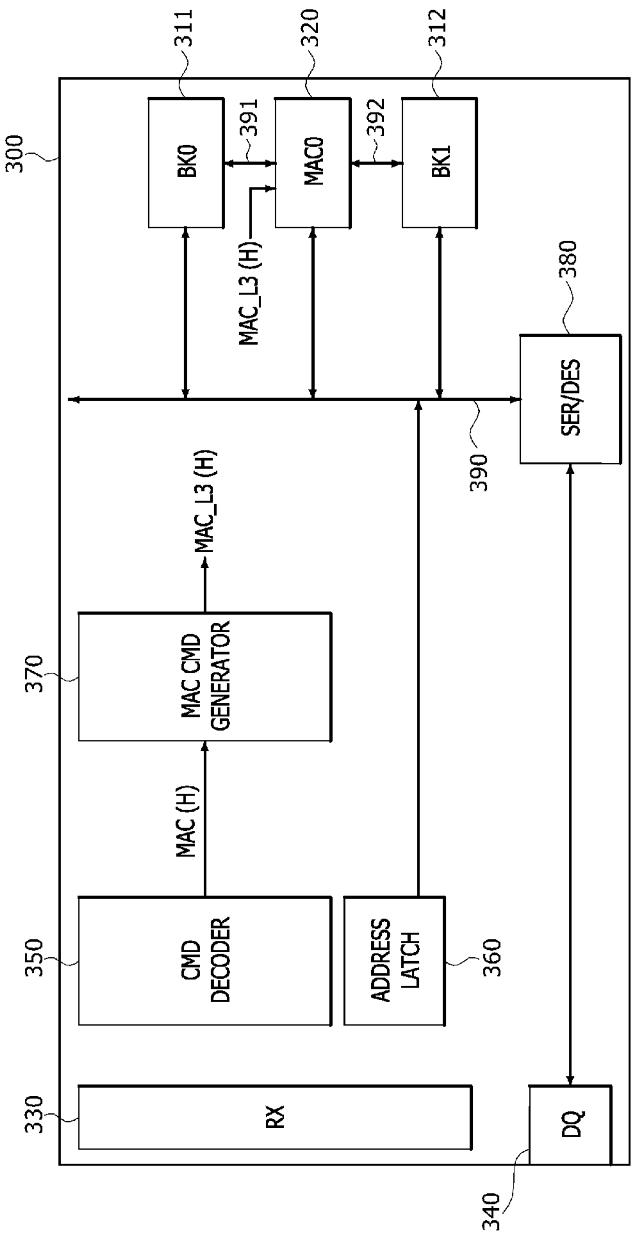

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit (222-2 of FIG. 20) for the accumulative adding calculation executed by the MAC circuit (222 of FIG. 20).

Figure 25:
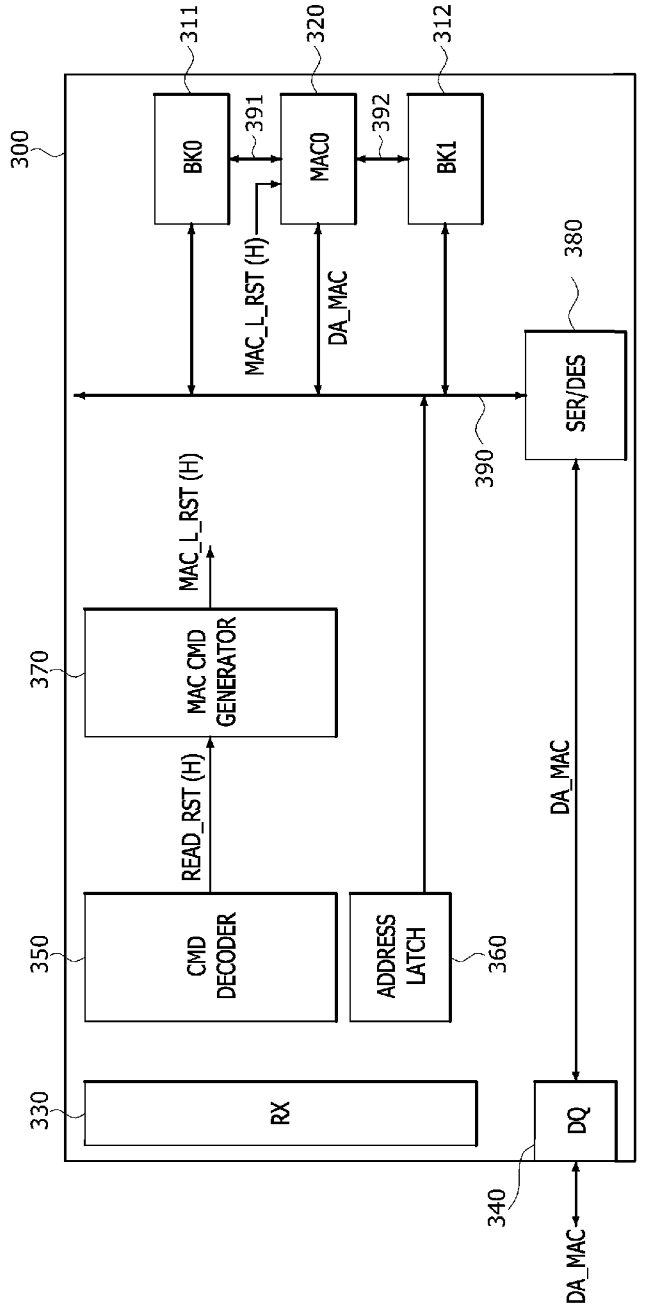

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
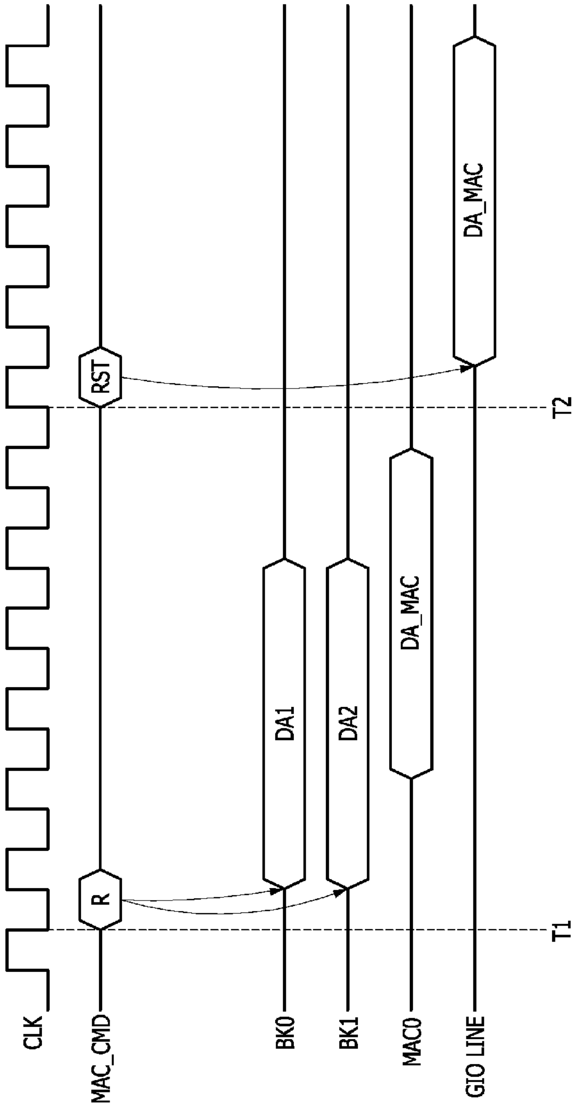
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1", the MAC command generator 370 may be synchronized with a falling edge of a clock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
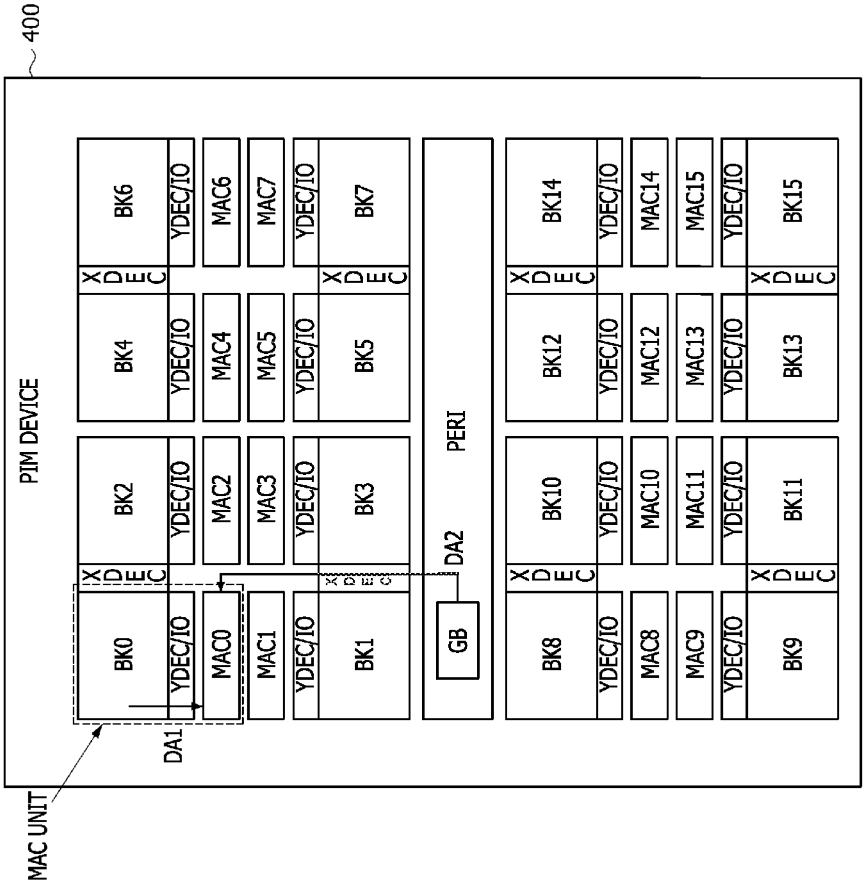
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, . . . , and BK15), processing devices such as a plurality of MAC operators (e.g., first to sixteenth MAC operators MAC0, . . . , and MAC15), and a global buffer GB. A core circuit may be disposed to be adjacent to the memory banks BK0, . . . , and BK15. The core circuit may include X-decoders XDECs and Y-decoders/IO circuits YDEC/IOs. The memory banks BK0, . . . , and BK15 and the core circuit may have the same configuration as described with reference to FIG. 2. Thus, descriptions of the memory banks BK0, . . . , and BK15 and the core circuit will be omitted hereinafter. The MAC operators MAC0, . . . , and MAC15 may be disposed to be allocated to the memory banks BK0, . . . , and BK15, respectively. That is, in the PIM device 400, two or more memory banks do not share one MAC operator with each other. Thus, the number of the MAC operators MAC0, . . . , and MAC15 included in the PIM device 400 may be equal to the number of the memory banks BK0, . . . , and BK15 included in the PIM device 400. One of the memory banks BK0, . . . , and BK15 together with one of the MAC operators MAC0, . . . , and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, . . . , and BK15; the MAC operators MAC0, . . . , and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERI of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
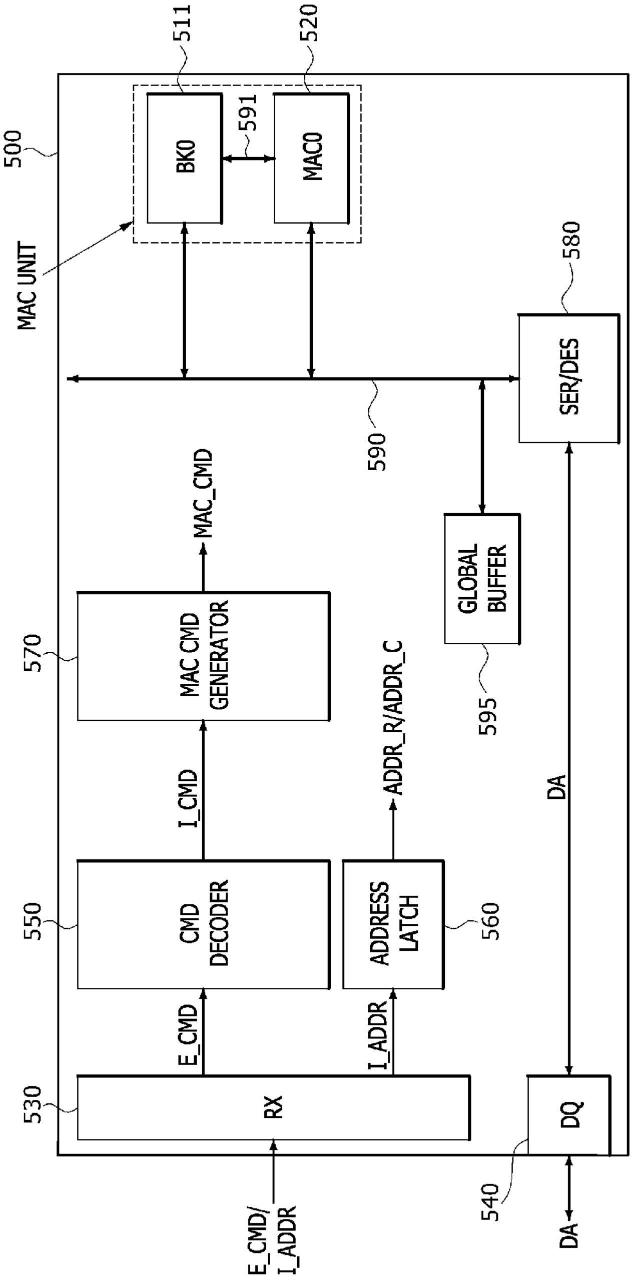
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or clocks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a clock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
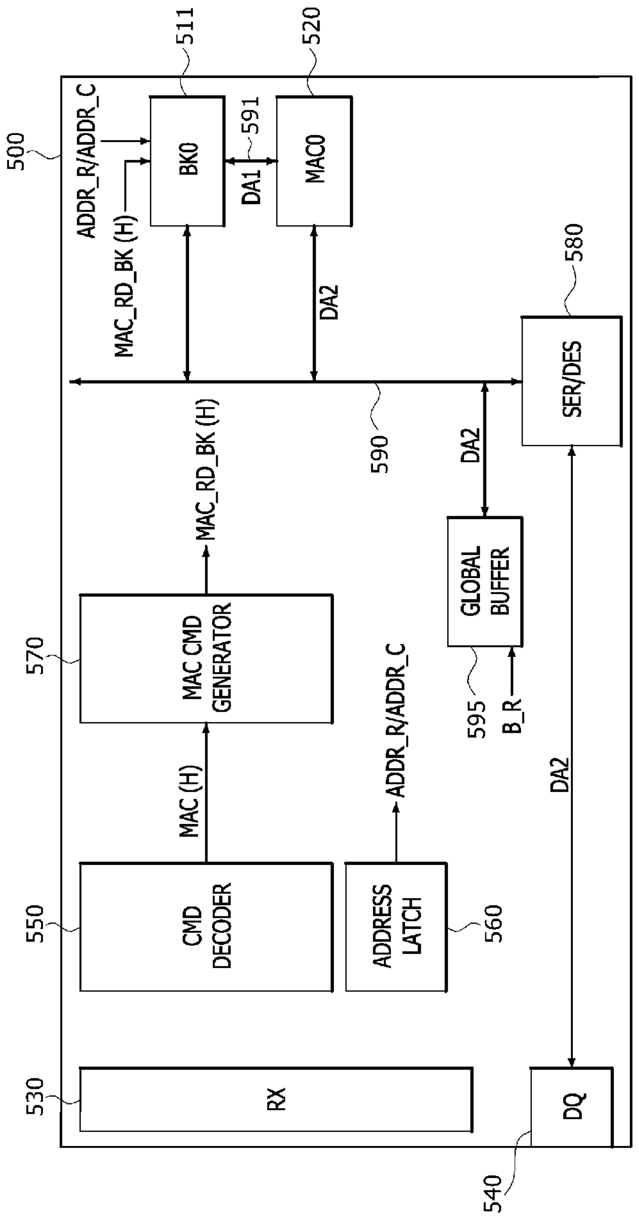
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0)

511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
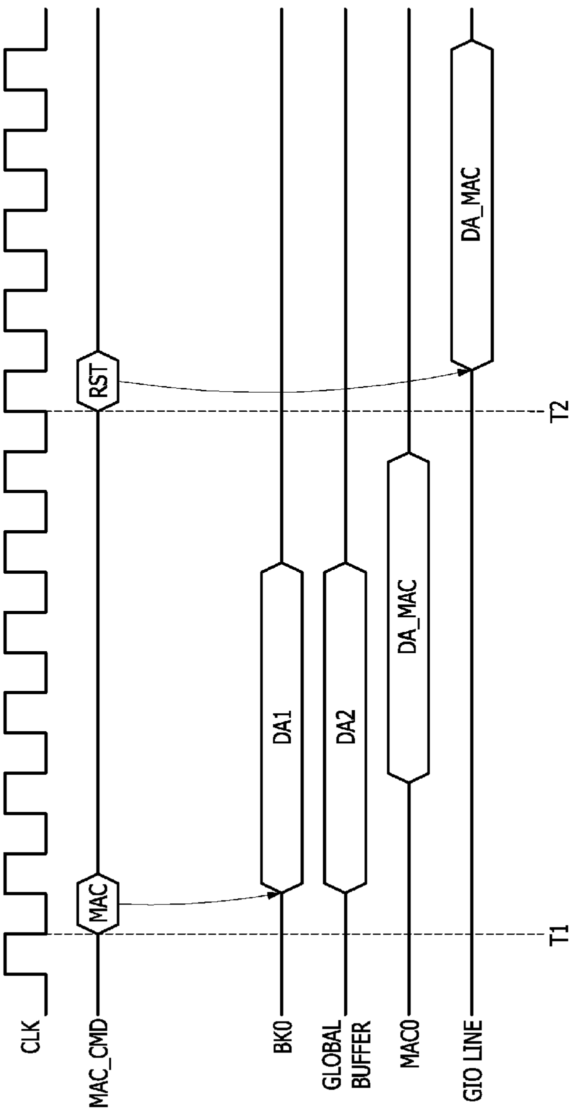
FIG. 30 is a timing diagram illustrating an operation of the PIM device illustrated in FIG. 28.

FIG. 30 is a timing diagram illustrating an operation of the PIM device 500 illustrate in FIG. 28. Referring to FIG. 30, at a first point in time "T1", the MAC command generator 570 may be synchronized with a falling edge of a clock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
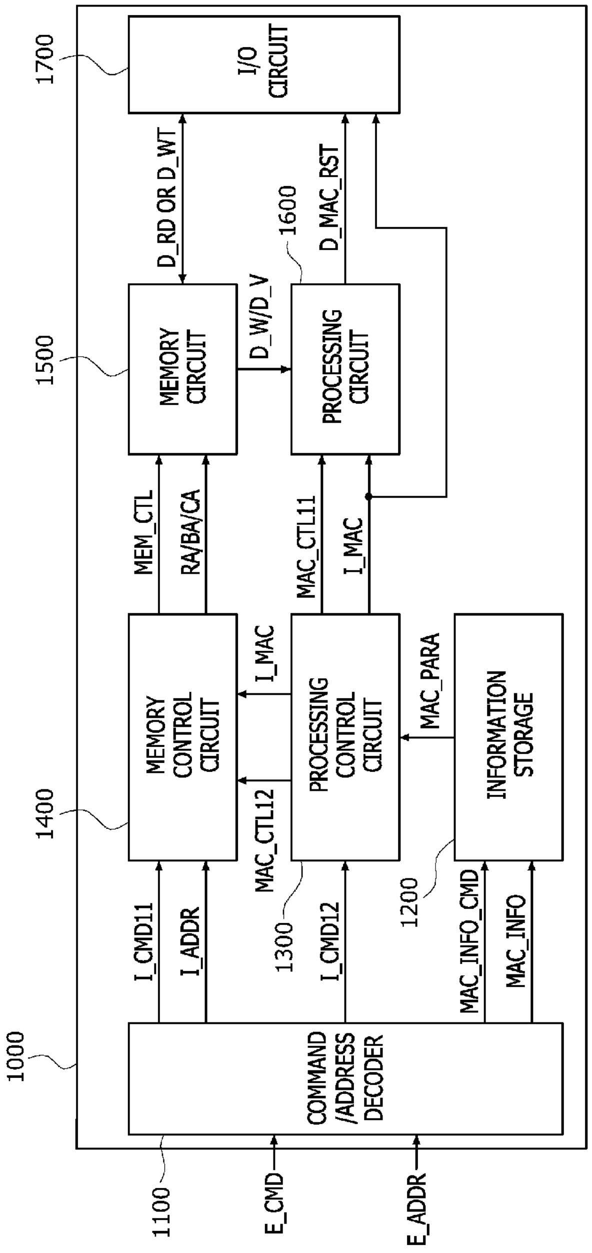
FIG. 31 is a block diagram illustrating a PIM device according to another embodiment of the present disclosure.

FIG. 31 is a block diagram illustrating a PIM device 1000 according to another embodiment of the present disclosure. Referring to FIG. 31, the PIM device 1000 may include a command/address decoder 1100, an information storage 1200, a processing control circuit 1300, a memory control circuit 1400, a memory circuit 1500, a processing circuit 1600, and an input/output (I/O) circuit 1700. The PIM device 1000 may perform various types of arithmetic operations while performing a memory function. In an example, the PIM device 1000 may perform operations including at least one of the following arithmetic operations: addition, multiplication, differentiation, integration, and accumulation, and a logical operation, such as AND, OR, and XOR. In the following various examples, a case in which the processing circuit 1600 performs a MAC arithmetic operation will be assumed. The MAC arithmetic operation may be performed through matrix vector multiplication for a weight matrix having weight data as elements and a vector matrix having vector data as elements.

The command/address decoder 1100 may receive an external command E_CMD and an external address E_ADDR from a host device. In various examples below, the host device may be a host, such as a CPU, a controller, or both. The command/address decoder 1100 may decode the external command E_CMD to generate and output a MAC information storage command MAC_INFO_CMD, a first internal command I_CMD11, or a second internal command I_CMD12. The command/address decoder 1100 may latch the external address E_ADDER to output an internal address I_ADDR or MAC information MAC_INFO. The command/address decoder 1100 may transmit the first internal command I_CMD11 and the internal address I_ADDR to the memory control circuit 1400. The command/address decoder 1100 may transmit the second internal command I_CMD12 to the processing control circuit 1300. In addition, the command/address decoder 1100 may transmit the MAC information storage command MAC_INFO_CMD and the MAC information MAC_INFO to the information storage 1200.

The command/address decoder 1100 may generate the first internal command I_CMD11 when the external command E_CMD is a command that requests a general memory access operation in the PIM device 1000. In various examples below, the term "general memory access operation" may refer to an access operation for the memory circuit 1500, which is performed regardless of the arithmetic operation of the processing circuit 1600. The general memory access operation may include a read operation, a write operation, an active operation, a pre-charge operation, and a refresh operation for general data in the memory circuit 1500.

The command/address decoder 1100 may generate the second internal command I_CMD12 when the external command E_CMD is a command that requests an arithmetic operation in the PIM device 1000. The arithmetic operation in the PIM device 1000 may include an arithmetic operation of the processing circuit 1600 and an arithmetic memory access operation of the memory circuit 1500. The "arithmetic memory access operation" may refer to an access operation to the memory circuit 1500, which is performed in association with the arithmetic operation of the processing circuit 1600. The arithmetic memory access operation may include a read operation, an active operation, a pre-charge operation, and a refresh operation for arithmetic data in the memory circuit 1500.

The command/address decoder 1100 may generate the MAC information storage command MAC_INFO_CMD when the external command E_CMD is a command for requesting an arithmetic information storage operation in the information storage 1200. When the MAC information storage command MAC_INFO_CMD is generated, the command/address decoder 1100 may transmit the MAC information MAC_INFO to the information storage 1200, together with the MAC information storage command MAC_INFO_CMD. In an example, the command/address decoder 1100 may decode the external address E_ADDR to extract the MAC information MAC_INFO. The MAC information MAC_INFO may include arithmetic parameters that are necessary for the processing control circuit 1300 to generate control signals. For example, the MAC information MAC_INFO may include command type, operation timing, address information of the memory circuit 1500 in which arithmetic data is stored, and the like.

The information storage 1200 may receive the MAC information storage command MAC_INFO_CMD and the MAC information MAC_INFO from the command/address decoder 1100. The information storage 1200 may store the MAC information MAC_INFO in response to the MAC information storage command MAC_INFO_CMD. To this end, the information storage 1200 may include a plurality of registers. In an example, the information storage 1200 may be configured with a mode register. In this case, when a mode register setting (MRS) command is received as the external command E_CMD, the command/address decoder 1100 may output the MAC information storage command MAC_INFO_CMD to the information storage 1200. The information storage 1200 may transmit arithmetic operation information necessary for a MAC arithmetic operation, among the stored MAC information MAC_INFO, to the processing control circuit 1300 as a MAC parameter MAC_PARA. Although not shown in the drawing, the information storage 1200 may receive a pulse signal that is generated in synchronization with a generation time of the second internal command I_CMD12. In addition, the information storage 1200 may transmit the MAC parameter MAC_PARA to the processing control circuit 1300 in response to the pulse signal.

The processing control circuit 1300 may receive the second internal command I_CMD12 from the command/address decoder 1100 and may receive the MAC parameter MAC_PARA from the information storage 1200. The processing control circuit 1300 may generate and output an internal MAC signal I_MAC, a first MAC control signal MAC_CTL11, and a second MAC control signal MAC_CTL12 in response to the input of the second internal command I_CMD12. The first MAC control signal MAC_CTL11 and the second MAC control signal MAC_CTL12 may be generated based on the MAC parameter MAC_PARA from the information storage 1200. According to the range of the MAC parameter MAC_PARA, the processing control circuit 1300 may perform a control operation so that the PIM device 1000 may operate in an internal MAC mode in which arithmetic operations in the processing circuit 1600 are continuously performed without additional transmission of the external command E_CMD from the host device.

The processing control circuit 1300 may transmit the internal MAC control signal I_MAC to the memory control circuit 1400 and the processing circuit 1600. In an example, the processing control circuit 1300 may change a logic level of the internal MAC signal I_MAC from a logic "low" level (i.e., '0') to a logic "high" level (i.e., '1') in response to the transmission of the second internal command I_CMD12. When an internal MAC signal I_MAC of a logic "high" level is transmitted, the internal MAC mode operations of the memory control circuit 1400, and the processing circuit 1600 may be activated. In an example, the processing control circuit 1300 may transmit the internal MAC signal I_MAC to the host device through the I/O circuit 1700. When the internal MAC signal I_MAC of the logic "high" level is transmitted to the host device through the I/O circuit 1700, the host device may consider that the PIM device 1000 operates in the internal MAC mode and may stop a transmission of an additional external command E_CMD to the PIM device 1000 until an internal MAC signal I_MAC of a logic "low" level is received. The processing control circuit 1300 may transmit the first MAC control signal MAC_CTL11 to the processing circuit 1600. The first MAC control signal MAC_CTL11 may control the MAC arithmetic operations of the processing circuit 1600 in the internal MAC mode. The processing control circuit 1300 may transmit the second MAC control signal MAC_CTL12 to the memory control circuit 1400. The second MAC control signal MAC_CTL12 may control the arithmetic memory access operation of the memory control circuit 1400 in the internal MAC mode.

The memory control circuit 1400 may receive the first internal command I_CMD11 and the internal address I_ADDR from the command/address decoder 1100. In addition, the memory control circuit 1400 may receive the internal MAC signal I_MAC and the second MAC control signal MAC_CTL12 from the processing control circuit 1300. The memory control circuit 1400 may generate a memory control signal MEM_CTL that controls the general access operation and the arithmetic memory access operation of the memory circuit 1500 and may transmit the memory control signal MEM_CTL to the memory circuit 1500. The memory control circuit 1400 may transmit a row address (RA)/bank address (BA)/column address (CA) to the memory circuit 1500, together with the memory control signal MEM_CTL. The memory control circuit 1400 may generate a memory control signal MEM_CTL that corresponds to the first internal command I_CMD11 or a memory control signal MEM_CTL that corresponds to the second MAC control signal MAC_CLT12 according to the logic level of the internal MAC signal I_MAC. In an example, the memory control circuit 1400 may generate the memory control signal MEM_CTL that corresponds to the first internal command I_CMD11 while the logic level of the internal MAC signal I_MAC maintains a logic "low" level. On the other hand, while the logic level of the internal MAC signal I_MAC maintains a logic "high" level, the memory control circuit 1400 may generate the memory control signal MEM_CTL that corresponds to the second MAC control signal MAC_CTL12.

The memory circuit 1500 may be configured with a volatile memory device, such as a dynamic random access memory (DRAM) device. The memory circuit 1500 may be configured with a nonvolatile memory device, such as a NAND memory device. The memory circuit 1500 may include both the volatile memory device and the nonvolatile memory device. The memory circuit 1500 may include a plurality of banks. The memory circuit 1500 may store write data D_WT that are transmitted from the host device through the I/O circuit 1700. In an example, the write data D_WT that are stored in the memory circuit 1500 may be data that are used for an arithmetic operation of the PIM device 1000 or data that are not used. Hereinafter, the data that are used for the arithmetic operation of the PIM device 1000 will be referred to as "arithmetic data", and the data that are not used for the arithmetic operation will be referred to as "general data". The arithmetic data may include weight data D_W and vector data D_V. The memory circuit 1500 may transmit the general data that are stored in the memory circuit 1500 to the host device through the I/O circuit 1700, as read data D_RD through a read operation. In addition, the memory circuit 1500 may transmit the arithmetic data that are stored in the memory circuit 1500, that is, the weight data D_W and the vector data D_V, to the processing circuit 1600 through a read operation. The general data transmission from the memory circuit 1500 to the host device and the arithmetic data transmission from the memory circuit 1500 to the processing circuit 1600 may be performed separately depending on whether the memory control signal MEM_CTL for controlling the read operation for the memory circuit 1500 is generated in response to the first internal command I_CMD11 or in response to the second MAC control signal MAC_CTL12.

The processing circuit 1600 may perform a MAC arithmetic operation by using the arithmetic data, that is, the weight data D_W and the vector data D_V that are provided from the memory circuit 1100 in response to the internal MAC signal I_MAC and the first MAC control signal MAC_CTL11 from the processing control circuit 1300. The processing circuit 1600 may generate and output MAC result data D_MAC_RST as a result of the MAC arithmetic operation. The processing circuit 1600 may include at least one MAC operator. In an example, when the memory circuit 1500 includes a plurality of banks, the processing circuit 1600 may include MAC operators that respectively correspond to the plurality of banks. The processing circuit 1600 may transmit the MAC result data D_MAC_RST to the host device through the I/O circuit 1700.

Figure 32:
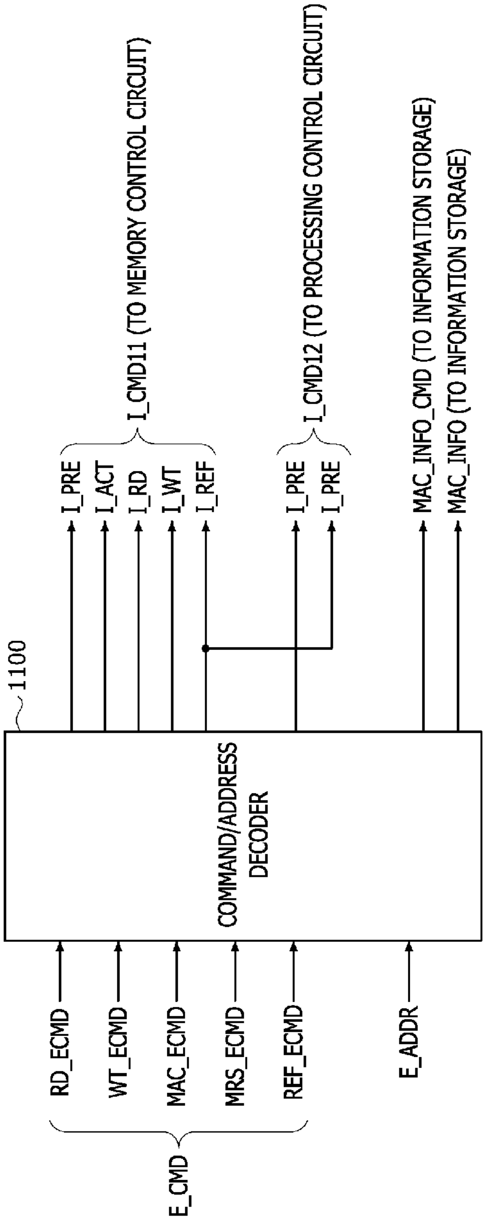
FIG. 32 illustrates an operation of a command/address decoder included in the PIM device of FIG. 31.

FIG. 32 illustrates an operation of the command/address decoder 1100 that is included in the PIM device 1000 of FIG. 31. Referring to FIG. 32, together with FIG. 31, the command/address decoder 1100 may receive an external command E_CMD and an external address E_ADDR from a host device. In an example, the external command E_CMD may include an external read command RD_ECMD, an external write command WT_ECMD, an external MAC command MAC_ECMD, an external mode register setting command MRS_ECMD, and an external refresh command REF_ECMD. The external read command RD_ECMD may be a command that requests a read operation for reading general data from the memory circuit 1500. Here, the read operation may correspond to a general memory access operation. The external write command WT_ECMD may be a command that requests a write operation for writing general data or arithmetic data to the memory circuit 1100. The external MAC command MAC_ECMD may be a command that requests an internal MAC mode operation of the PIM device 1000. The external mode register setting command MRS_ECMD may be a command that requests a MAC information storage operation for the information storage 1200. In addition, the external refresh command REF_ECMD may be a command that requests a refresh operation for the memory circuit 1500.

The command/address decoder 1100 may decode the external command E_CMD to generate and output a first internal command I_CMD11, a second internal command I_CMD12, or a MAC information storage command MAC_INFO_CMD. Although not shown in FIG. 32, the command/address decoder 1100 may latch an external address E_ADDR to output an internal address I_ADDR or MAC information MAC_INFO. When the command/address decoder 1100 generates and outputs the first internal command I_CMD11, the internal address I_ADDR may also be output from the command/address decoder 1100, together with the first internal command I_CMD11. When the command/address decoder 1100 generates and outputs the second internal command I_CMD12, the command/address decoder 1100 might not output the internal address I_ADDR. When the command/address decoder 1100 generates and outputs the MAC information storage command MAC_INFO_CMD, the MAC information MAC_INFO may also be output from the command/address decoder 1100, together with the MAC information storage command MAC_INFO_CMD. The command/address decoder 1100 may transmit the first internal command I_CMD11 to the memory control circuit 1400. The command/address decoder 1100 may transmit the second internal command I_CMD12 to the processing control circuit 1300. The command/address decoder 1100 may transmit the MAC information storage command MAC_INFO_CMD and the MAC information MAC_INFO to the information storage 1200.

The first internal command I_CMD11 that is output from the command/address decoder 1100 may include internal commands that request the general memory access operations for the memory circuit 1500, for example, an internal pre-charge command I_PRE, an internal active command I_ACT, an internal read command I_RD, an internal write command I_WT, and an internal refresh command I_REF. The internal pre-charge command I_PRE may request an operation for pre-charging a selected row of the memory circuit 1500. The row to be pre-charged may be selected by the internal address I_ADDR that is generated as a result of decoding the external address E_ADDR. The internal active command I_ACT may request an operation for activating the pre-charged row. The internal read command I_RD may request a read operation for the memory circuit 1500. The internal write command I_WT may request a write operation for the memory circuit 1500. In addition, the internal refresh command I_REF may request a refresh operation for the memory circuit 1500.

When the external read command RD_ECMD is transmitted as the external command E_CMD from the host device, the command/address decoder 1100 may generate and output the internal pre-charge command I_PRE, the internal active command I_ACT, and the internal read command I_RD as the first internal command I_CMD11. When the external write command WT_ECMD is transmitted as the external command E_CMD from the host device, the command/address decoder 1100 may generate and output the internal active command I_ACT and the internal write command I_WT as the first internal command I_CMD11. When the external refresh command REF_ECMD is transmitted as the external command E_CMD from the host device, the command/address decoder 1100 may generate and output the internal active command I_ACT and the internal refresh command I_REF as the first internal command I_CMD11.

The second internal command I_CMD12 that is output from the command/address decoder 1100 may include an internal initiation command INIT and an internal refresh command I_REF. The internal initiation command INIT may request the operations of the memory circuit 1500 and the operations of the processing circuit 1600 that are related to the internal MAC mode operation of the PIM device 1000. For example, the internal initiation command INIT may request a MAC arithmetic operation or an active function operation of the processing circuit 1600. The internal initiation command INIT may request a read operation or a write operation on the arithmetic data, for example, weight data or vector data. The internal initiation command INIT may request a read operation on the MAC result data of the processing circuit 1600.

The internal refresh command I_REF that is output from the command/address decoder 1100 as the second internal command I_CMD12 may be the same as the internal refresh command I_REF that is output from the command/address decoder 1100 as the first internal command I_CMD11. That is, the command/address decoder 1100 may generate the internal refresh command I_REF in response to transmission of the external refresh command REF_ECMD and may transmit the generated internal refresh command I_REF to the memory control circuit 1400 and the processing control circuit 1300 as the first internal command I_CMD11 and the second internal command I_CMD12, respectively.

When the external MAC command MAC_ECMD is transmitted from the host device, the command/address decoder 1100 may generate and output the internal initiation command INIT as the second internal command I_CMD12. When the external refresh command REF_ECMD is transmitted from the host device, the command/address decoder 1100 may generate and output the internal refresh command I_REF as the second internal command I_CMD12. The command/address decoder 1100 may transmit the internal initiation command INIT and the internal refresh command I_REF to the processing control circuit 1300.

When the external mode register setting command MRS_ECMD is transmitted from the host device, the command/address decoder 1100 may generate and output the MAC information storage command MAC_INFO_CMD. In this case, the command/address decoder 1100 may also output the MAC information MAC_INFO, included in the external address E_ADDR, transmitted from the host device.

The command/address decoder 1100 may transmit the MAC information storage command MAC_INFO_CMD and the MAC information MAC_INFO to the information storage 1200.

Figure 33:
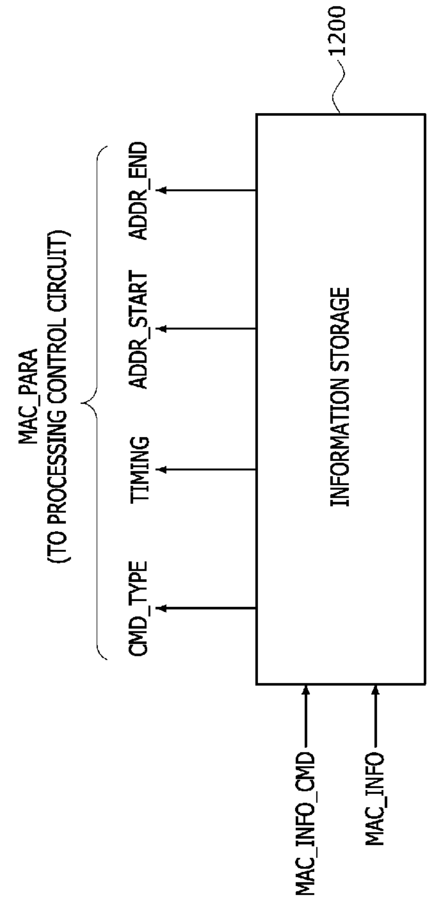
FIG. 33 illustrates an operation of an information storage included in the PIM device of FIG. 31.

FIG. 33 illustrates an operation of the information storage 1200 included in the PIM device 1000 of FIG. 31. Referring to FIG. 33, together with FIG. 31, the information storage 1200 may store MAC information MAC_INFO that is transmitted from the command/address decoder 1100 in response to a MAC information storage command MAC_INFO_CMD that is transmitted from the command/address decoder 1100. Although not shown in FIG. 33, information that is necessary for the PIM device 1000 to operate as a general memory device may also be stored in the information storage 1200. The information storage 1200 may output arithmetic operation information that is necessary for a MAC arithmetic operation, among the stored MAC information MAC_INFO, as a MAC parameter MAC_PARA. In an example, the MAC parameter MAC_PARA may include command type CMD_TYPE, timing TIMING, a start address ADDR_START, and an end address ADDR_END. The command type CMD_TYPE may designate control signals that are necessary for performing a read operation on arithmetic data in the memory circuit 1500 and a MAC arithmetic operation in the processing circuit 1600. The timing TIMING may designate the generation time of the control signals that are designated by the command type CMD_TYPE. The start address ADDR_START may designate a start address of the arithmetic data to be transmitted from the memory circuit 1500 to the processing circuit 1600. The end address ADDR_END may designate the last address of the arithmetic data to be transmitted from the memory circuit 1500 to the processing circuit 1600. The MAC parameter MAC_PARA that is output from the information storage 1200 may be transmitted to the processing control circuit 1300.

Figure 34:
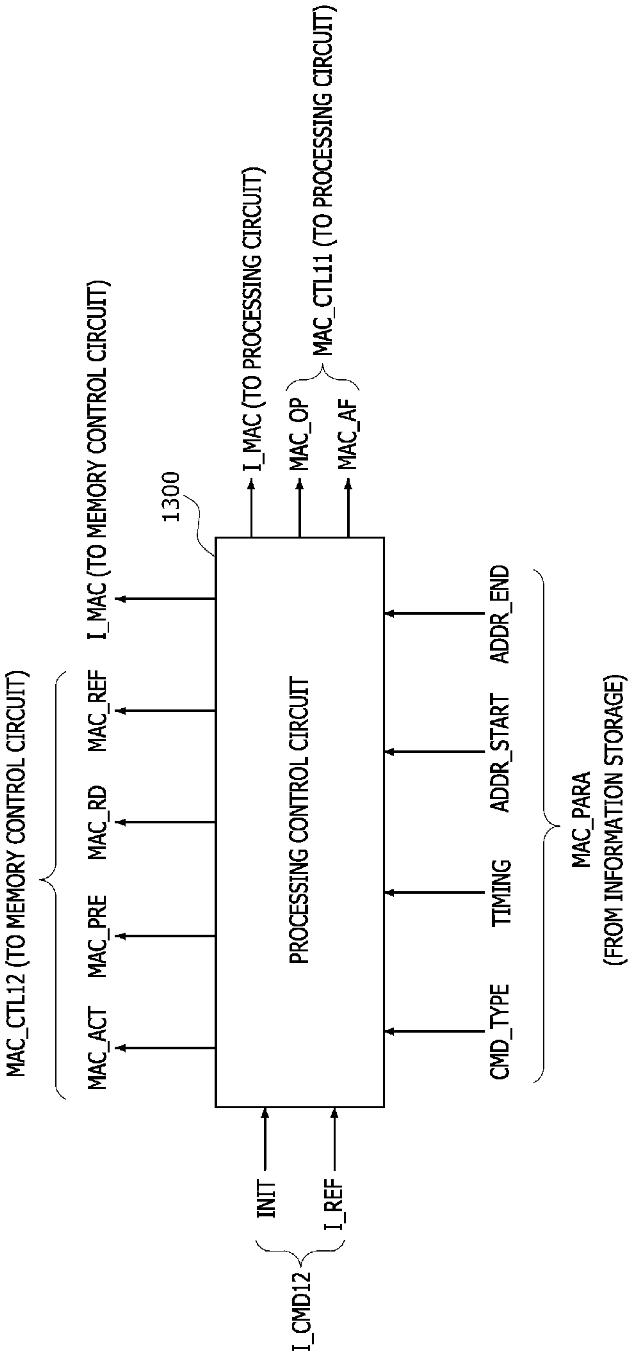
FIG. 34 illustrates an operation of a processing control circuit included in the PIM device of FIG. 31.

FIG. 34 illustrates an operation of the processing control circuit 1300 included in the PIM device 1000 of FIG. 31. Referring to FIG. 34, together with FIG. 31, the processing control circuit 1300 may receive a second internal command I_CMD12, that is, an internal initiation command INIT and an internal refresh command I_REF from the command/address decoder 1100. In addition, the processing control circuit 1300 may receive MAC parameters MAC_PARAs, that is, command type CMD_TYPE, timing TIMING, a start address ADDR_START, and an end address ADDR_END from the information storage 1200. When the internal start command INIT and the internal refresh command I_REF are transmitted as the second internal command I_CMD12, the processing control circuit 1300 may generate and output a first MAC control signal MAC_CTL11, a second MAC control signal MAC_CTL12, and an internal MAC signal I_MAC with reference to the MAC parameters MAC_PARAs. The processing control circuit 1300 may transmit the first MAC control signal MAC_CTL11 and the internal MAC signal I_MAC to the processing circuit 1600. The processing control circuit 1300 may transmit the second MAC control signal MAC_CTL12 and the internal MAC signal I_MAC to the memory control circuit 1400.

The internal MAC signal I_MAC that is output from the processing control circuit 1300 may provide information regarding an enable state or a disable state of an internal MAC mode to the memory control circuit 1400 and the operation circuit 1600. When the internal MAC mode is enabled, the PIM device 1000 may perform a MAC arithmetic operation by itself without an additional request from the host device. In an example, when the internal MAC signal I_MAC is at a logic "high" level, the memory control circuit 1400 and the processing circuit 1600 may operate in the internal MAC mode. That is, while the logic level of the internal MAC signal I_MAC is maintained at the logic "high" level, the memory control circuit 1400 may suspend generation of a memory control signal MEM_CTL that corresponds to the first internal command I_CMD11 and may generate a memory control signal MEM_CTL that corresponds to the second MAC control signal MAC_CTL12 that is transmitted from the processing control circuit 1300. In addition, the processing circuit 1600 may perform MAC arithmetic operations by using the weight data D_W and the vector data D_V that are provided from the memory circuit 1500. In the internal MAC mode, the MAC arithmetic operations in the processing circuit 1600 may be performed until all MAC arithmetic operations on the arithmetic data that are designated by the start address ADDR_START and the end address ADDR_END that are provided from the information storage 1200 are performed. While the logic level of the internal MAC signal I_MAC is maintained at the logic "high" level, the processing circuit 1600 may perform an active function arithmetic operation by using active function data that are provided from the memory circuit 1500. On the other hand, when the internal MAC signal I_MAC is at a logic "low" level, the memory control circuit 1400 and the processing circuit 1600 might not perform the operations of the internal MAC mode. That is, while the logic level of the internal MAC signal I_MAC is maintained at a logic "low" level, the memory control circuit 1400 may generate and output the memory control signal MEM_CTL that corresponds to the first internal command I_CMD11. In addition, the processing circuit 1600 might not perform the MAC arithmetic operation or the active function arithmetic operation.

The first MAC control signal MAC_CTL11 may include a MAC operation control signal MAC_OP and a MAC active function control signal MAC_AF. The MAC operation control signal MAC_OP may control the MAC arithmetic operation of the processing circuit 1600. The MAC active function control signal MAC_AF may control the active function application operation of the processing circuit 1600. The second MAC control signal MAC_CTL12 may include a MAC active control signal MAC_ACT, a MAC pre-charge control signal MAC_PRE, a MAC read control signal MAC_RD, and a MAC refresh control signal MAC_REF. The MAC active control signal MAC_ACT may control an activation operation on a row, among the rows of the memory circuit 1500, in which the arithmetic data (i.e., weight data D_W and vector data D_V) is stored. The MAC pre-charge control signal MAC_PRE may control a pre-charge operation on a row that is activated by the MAC active control signal MAC_ACT. The MAC read control signal MAC_RD may control a MAC read operation to provide the arithmetic data from the memory circuit 1500 to the processing circuit 1600. The MAC refresh control signal MAC_REF may control a refresh operation for the memory circuit 1500.

Figure 35:
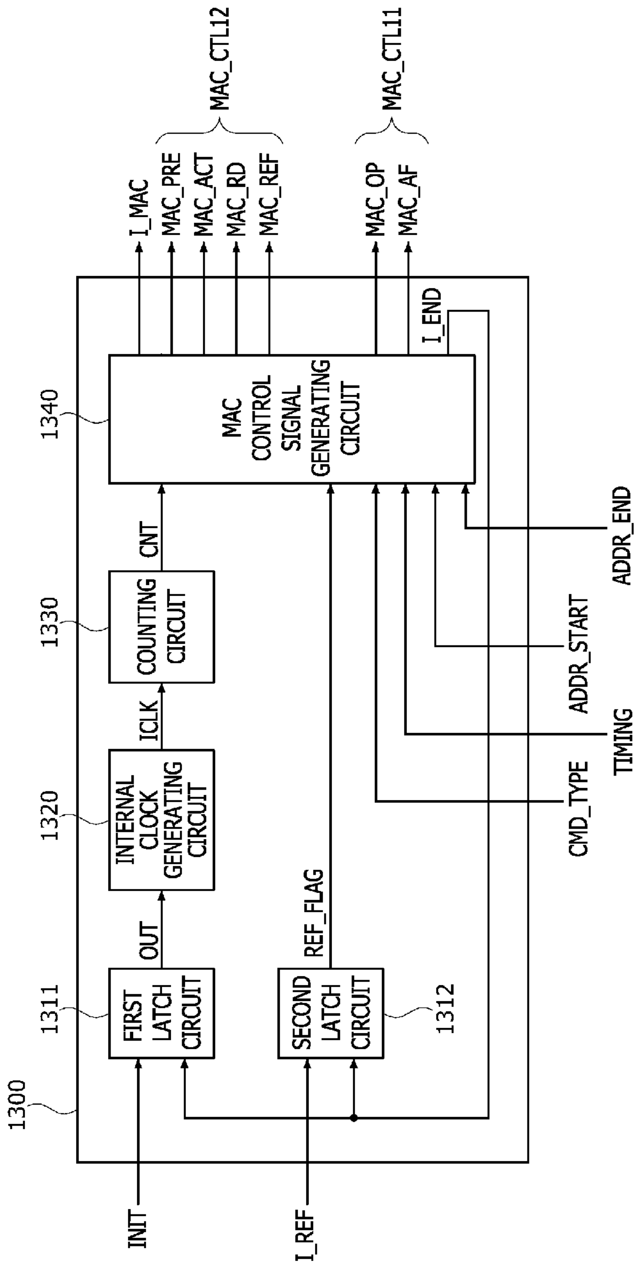
FIG. 35 is a block diagram illustrating an example of a configuration of a processing control circuit included in the PIM device of FIG. 31.

FIG. 35 is a block diagram illustrating an example of a configuration of the processing control circuit 1300, included in the PIM device 1000 of FIG. 31. Referring to FIG. 35, together with FIG. 31, the processing control circuit 1300 may include a first latch circuit 1311, a second latch circuit 1312, an internal clock generating circuit 1320, a counting circuit 1330, and a MAC control signal generating circuit 1340. The first latch circuit 1311 may receive an internal initiation command INIT that is transmitted from the command/address decoder 1100. In addition, the first latch circuit 1311 may receive a MAC end signal I_END that is output from the MAC control signal generation circuit 1340 as feedback. The first latch circuit 1311 may latch the internal initiation command INIT and may output an output signal OUT that corresponds to the latched internal initiation command INIT. The first latch circuit 1311 may transmit the output signal OUT to the internal clock generating circuit 1320. When a MAC end signal I_END of a logic "high" level is transmitted from the MAC control signal generating circuit 1340, the first latch circuit 1311 might not output the output signal OUT anymore.

The second latch circuit 1312 may receive an internal refresh command I_REF that is transmitted from the command/address decoder 1100. In addition, the second latch circuit 1312 may receive a MAC end signal MA_END that is output from the MAC control signal generating circuit 1340 as feedback. The second latch circuit 1312 may latch the internal refresh command I_REF and may output a refresh flag signal REF_FLAG that corresponds to the latched internal refresh command I_REF. In an example, when the internal refresh command I_REF is received, the second latch circuit 1312 may change a logic level of the refresh flag signal REF_FLAG from a logic "low" level to a logic "high" level. The second latch circuit 1312 may transmit the refresh flag signal REF_FLAG to the MAC control signal generating circuit 1340. When a MAC end signal I_END of a logic "high" level is transmitted from the MAC control signal generating circuit 1340, the second latch circuit 1312 may change the logic level of the refresh flag signal REF_FLAG from a logic "high" level to a logic "low" level.

The internal clock generating circuit 1320 may generate and output an internal clock signal ICLK in response to the input of the output signal OUT from the first latch circuit 1311. In an example, the internal clock generating circuit 1320 may include a ring oscillator delay (ROD). The internal clock generating circuit 1320 may transmit the internal clock signal ICLK to the counting circuit 1330. The counting circuit 1330 may perform a counting operation in synchronization with the internal clock signal ICLK that is transmitted from the internal clock generating circuit 1320. The counting circuit 1330 may output a counting value CNT that is generated through the counting operation. The counting circuit 1330 may transmit the counting value CNT to the MAC control signal generating circuit 1340.

The MAC control signal generating circuit 1340 may receive the counting value CNT from the counting circuit 1330 and may receive the refresh flag signal REF_FLAG from the second latch circuit 1312. The MAC control signal generating circuit 1340 may receive the MAC parameters, that is, the command type CMD_TYPE, the timing TIMING, the start address ADDR_START, and the end address ADDR_END from the information storage 1200. When the counting value CNT that is transmitted from the counting circuit 1330 corresponds to a first counting value, the MAC control signal generating circuit 1340 may change the logic level of the internal MAC signal I_MAC from a logic "low" level to a logic "high" level. In an example, the first counting value may be a counting value that is first output from the counting circuit 1330. The first counting value may be determined by the timing TIMING, among the MAC parameters MAC_PARA that are transmitted from the information storage 1200. The MAC control signal generating circuit 1340 may transmit the internal MAC signal I_MAC of the logic "high" level to the memory control circuit 1400 and the processing circuit 1600.

When the counting value CNT that is transmitted from the counting circuit 1330 corresponds to a second counting value, the MAC control signal generating circuit 1340 may change the logic level of the MAC pre-charge control signal MAC_PRE from a logic "low" level to a logic "high" level. The second counting value may be a value that is greater than the first counting value. The second counting value may also be determined by the timing TIMING. The MAC control signal generating circuit 1340 may transmit the MAC pre-charge control signal MAC_PRE of the logic "high" level to the memory control circuit 1400 as the second MAC control signal MAC_CLT12. In some cases, the process in which the MAC control signal generating circuit 1340 outputs the MAC pre-charge control signal MAC_PRE of the logic "high" level may be omitted. When the counting value CNT that is transmitted from the counting circuit 1330 corresponds to a third counting value, the MAC control signal generating circuit 1340 may change the logic level of the MAC active control signal MAC_ACT from a logic "low" level to a logic "high" level. The third counting value may be a value that is greater than the second counting value. The third counting value may also be determined by the timing TIMING. The MAC control signal generating circuit 1340 may transmit the MAC active control signal MAC_ACT of the logic "high" level to the memory control circuit 1400 as the second MAC control signal MAC_CTL12.

When the counting value CNT that is transmitted from the counting circuit 1330 corresponds to a fourth counting value, the MAC control signal generating circuit 1340 may generate a plurality of pulses of a MAC read control signal MAC_RD and a plurality of pulses of a MAC operation control signal MAC_OP. The fourth counting value may be a value that is greater than the third counting value. The fourth counting value may also be determined by the timing TIMING. The MAC control signal generating circuit 1340 may transmit the MAC read control signal MAC_RD that has the plurality of pulses to the memory control circuit 1400 as the second MAC control signal MAC_CTL12. In addition, the MAC control signal generating circuit 1340 may transmit the MAC operation control signal MAC_OP that has the plurality of pulses to the processing circuit 1600 as the first MAC control signal MAC_CTL11. The generation time of each of the pulses of the MAC read control signal MAC_RD and the MAC operation control signal MAC_OP may be determined by the timing TIMING.

When the counting value CNT that is transmitted from the counting circuit 1330 corresponds to the fourth counting value, the MAC control signal generating circuit 1340 may generate a MAC active function control signal MAC_AF that has a plurality of pulses, instead of the MAC operation control signal MAC_OP that has the plurality of pulses. Whether the MAC control signal generating circuit 1340 generates the MAC operation control signal MAC_OP or the MAC active function control signal MAC_AF may be determined by the command type CMD_TYPE, among the MAC parameters MAC_PARA that are transmitted from the information storage 1200. The MAC control signal generating circuit 1340 may transmit the MAC active function control signal MAC_AF that has the plurality of pulses to the processing circuit 1600 as the first MAC control signal MAC_CTL11.

When a refresh flag signal REF_FLAG of a logic "high" level is transmitted from the second latch circuit 1312, the MAC control signal generating circuit 1340 may output a MAC refresh control signal MAC_REF of a logic "high" level after the MAC arithmetic operation or the MAC active function processing is finished. The point in time at which the MAC refresh control signal MAC_REF of a logic "high" level is output from the MAC control signal generating circuit 1340 may be determined by the timing TIMING. The MAC control signal generating circuit 1340 may transmit the MAC refresh control signal MAC_REF to the processing circuit 1600 as the first MAC control signal MAC_CTL11. In this case, the MAC control signal generating circuit 1340 may first output a MAC active control signal MAC_ACT for activating the row to be refreshed of the memory circuit 1500 before outputting the MAC refresh control signal MAC_REF.

The MAC control signal generating circuit 1340 may determine control signals to be generated and output timings of the control signals, based on the command type CMD_TYPE, the timing TIMING, the start address ADDR_START, and the end address ADDR_END that are transmitted from the information storage 1200. As a first example, when a first command type is transmitted from the information storage 1200 as the command type CMD_TYPE, the MAC control signal generation circuit 1340 may generate and output an internal MAC signal I_MAC, a MAC pre-charge control signal MAC-PRE, a MAC active control signal MAC_ACT, a MAC read control signal MAC_RD, and a MAC operation control signal MAC_OP. In this case, the counting value CNT that designates the point in time at which the internal MAC signal I_MAC and the control signals are generated may be determined by the timing TIMING that is transmitted from the information storage 1200. In addition, designation of the arithmetic data that is used for the MAC arithmetic operation may be determined by the start address ADDR_START and the end address ADDR_END that are transmitted from the information storage 1200. In a second example, when a second command type is transmitted as the command type CMD_TYPE from the information storage 1200, the MAC control signal generation circuit 1340 may generate and output an internal MAC signal I_MAC, a MAC pre-charge control signal MAC_PRE, a MAC active control signal MAC_ACT, a MAC read control signal MAC_RD, and a MAC active function control signal MAC_AF. Even in this case, the counting value CNT that designates a point in time at which the internal MAC signal I_MAC and control signals are generated may be determined by the timing TIMING that is transmitted from the information storage 1200. In addition, designation of the active function data that is used for the MAC arithmetic operation may be determined by the start address ADDR_START and the end address ADDR_END that are transmitted from the information storage 1200.

Figure 36:
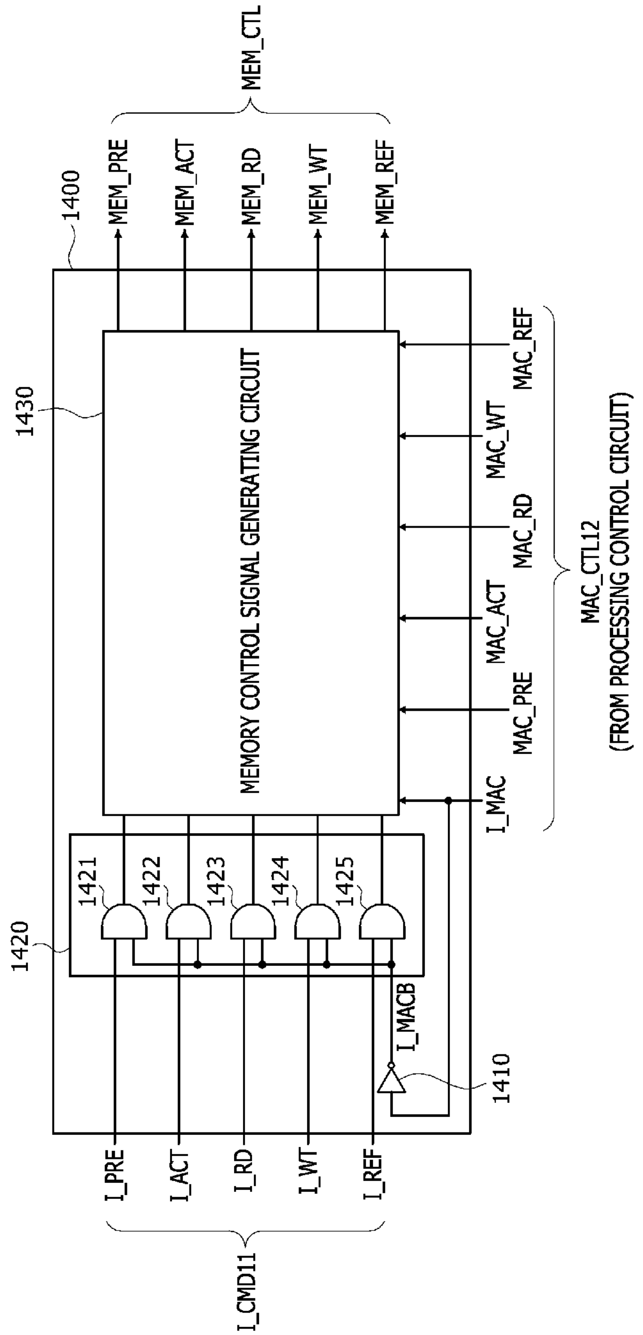
FIG. 36 is a circuit diagram illustrating examples of the configuration and operation of a memory control circuit included in the PIM device of FIG. 31.

FIG. 36 is a circuit diagram illustrating examples of the configuration and the operation of the memory control circuit 1400 included in the PIM device 1000 of FIG. 31. Referring to FIG. 36, together with FIG. 31, the memory control circuit 1400 may include an inverter 1410, a command blocking circuit 1420, and a memory control signal generating circuit 1430. The inverter 1410 may receive an internal MAC signal I_MAC. The inverter 1410 may output an inverted internal MAC signal I_MACB in which the logic level of the internal MAC signal I_MAC is inverted. The inverted internal MAC signal I_MACB that is output from the inverter 1410 may be transmitted to the command blocking circuit 1420.

The command blocking circuit 1420 may perform or block the transmission of commands PRE, ACT, RD, WT, and REF to the memory control signal generating circuit 1430 depending on the logic level of the inverted internal MAC signal I_MACB that is transmitted from the inverter 1410. In an example, the command blocking circuit 1420 may include first to fifth AND gates 1421-1425. Each of the first to fifth AND gates 1421-1425 may include a first input terminal, a second terminal, and an output terminal. The first AND gate 1421 may receive an internal pre-charge command I_PRE through the first input terminal. The second AND gate 1422 may receive an internal active command I_ACT through the first input terminal. The third AND gate 1423 may receive an internal read command I_RD through the first input terminal. The fourth AND gate 1424 may receive an internal write command I_WT through the first input terminal. In addition, the fifth AND gate 1425 may receive an internal refresh command I_REF through the first input terminal. Each of the first to fifth AND gates 1421-1425 may receive the inverted internal MAC signal I_MACB that is output from the inverter 1410 through the second input terminal. The output terminals of the first to fifth NAD gates 1421-1425 may be coupled to the memory control signal generating circuit 1430. When the internal MAC signal I_MAC is at a logic "low" level, that is, when the inverted internal MAC signal I_MACB is at a logic "high" level, each of the first to fifth AND gates 1421-1425 may transmit the internal command that is received through the first input terminal to the memory control signal generating circuit 1430 through the output terminal. On the other hand, when the internal MAC signal I_MAC is at a logic "high" level, that is, when the inverted internal MAC signal I_MACB is at a logic "low" level, each of the first to fifth AND gates 1421-1425 might not output the internal command that is received through the first input terminal.

The memory control signal generating circuit 1430 may receive the internal MAC signal I_MAC and the first MAC control signal MAC_CTL11 from the processing control circuit 1300. The memory control signal generating circuit 1430 may receive the internal commands I_PRE, I_ACT, I_RD, I_WT, and I_REF through the command blocking circuit 1420. The memory control signal generating circuit 1430 may generate and output a memory control signal MEM_CTL. The memory control signal MEM_CTL may include a memory pre-charge control signal MEM_PRE, a memory active control signal MEM_ACT, a memory read control signal MEM_RD, a memory write control signal MEM_WT, and a memory refresh control signal MEM_REF. The memory pre-charge control signal MEM_PRE may control a pre-charge operation of the memory circuit 1500. The memory active control signal MEM_ACT may control an active operation of the memory circuit 1500. The memory read control signal MEM_RD may control a read operation of the memory circuit 1500. The memory write control signal MEM_WT may control a write operation of the memory circuit 1500. In addition, the memory refresh control signal MEM_REF may control a refresh operation of the memory circuit 1500.

When an internal MAC signal I_MAC of a logic "low" level is transmitted from the processing control circuit 1300, the memory control signal generating circuit 1430 may generate the memory control signal MEM_CTL that corresponds to the internal commands I_PRE, I_ACT, I_RD, I_WT, and I_REF that are transmitted through the command blocking circuit 1420. For example, when the internal pre-charge command I_PRE is received, the memory control signal generating circuit 1430 may generate and transmit the memory pre-charge control signal MEM_PRE to the memory circuit 1500 as the memory control signal MEM_CTL. When the internal active command I_ACT is received, the memory control signal generating circuit 1430 may generate the memory active control signal MEM_ACT as the memory control signal MEM_CTL and transmit the generated memory active control signal MEM_ACT to the memory circuit 1500. When the internal read command I_RD is received, the memory control signal generating circuit 1430 may generate and transmit the memory read control signal MEM_RD to the memory circuit 1500 as the memory control signal MEM_CTL. When the internal write command I_WT is received, the memory control signal generating circuit 1430 may generate and transmit the memory write control signal MEM_WT to the memory circuit 1500 as the memory control signal MEM_CTL. When the internal refresh command I_REF is received, the memory control signal generation circuit 1430 may generate and transmit the memory refresh control signal MEM_REF to the memory circuit 1500 as the memory control signal MEM_CTL.

When an internal MAC signal I_MAC of a logic "high" level is transmitted from the processing control circuit 1300, the memory control signal generating circuit 1430 may generate a memory control signal MEM_CTL that corresponds to the first MAC control signal MAC_CTL11. For example, when a MAC pre-charge control signal MEM_PRE is received, the memory control signal generating circuit 1430 may generate and transmit the memory pre-charge control signal MEM_PRE to the memory circuit 1500 as the memory control signal MEM_CTL. When a MAC active command MAC_ACT is received, the memory control signal generating circuit 1430 may generate and transmit the memory active control signal MEM_ACT to the memory circuit 1500 as the memory control signal MEM_CTL. When a MAC read command MAC_RD is received, the memory control signal generating circuit 1430 may generate and transmit the memory read control signal MEM_RD to the memory circuit 1500 as the memory control signal MEM_CTL. When a MAC write command MAC_WT is received, the memory control signal generating circuit 1430 may generate and transmit the memory write control signal MEM_WT to the memory circuit 1500 as the memory control signal MEM_CTL. When a MAC refresh command MAC_REF is received, the memory control signal generating circuit 1430 may generate and transmit the memory refresh control signal MAC_REF to the memory circuit 1500 as the memory control signal MEM_CTL.

Figure 37:
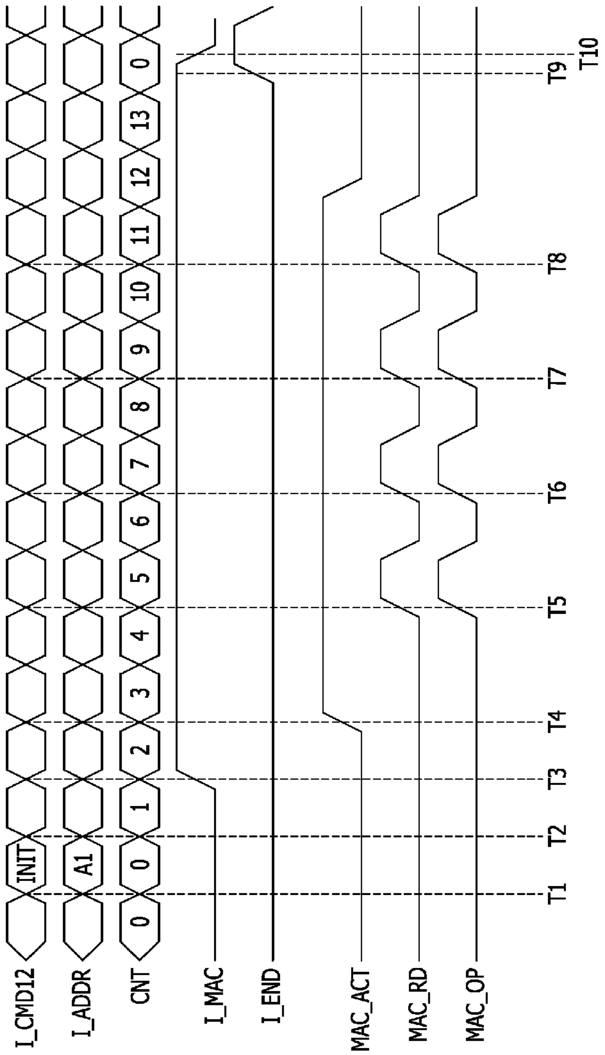
FIG. 37 is a timing diagram illustrating an internal MAC arithmetic operation of the PIM device of FIG. 31.

FIG. 37 is a timing diagram illustrating an internal MAC arithmetic operation of the PIM device 1000 of FIG. 31. Hereinafter, a case in which an external MAC command MAC_ECMD is transmitted from a host device to the command/address decoder 1100 of the PIM device 1000 will be exemplified. Referring to FIG. 37, together with FIG. 31, the command/address decoder 1100 that has received the external MAC command MAC_ECMD may generate an internal initiation command INIT at a first point in time "T1" and may transmit the generated internal initiation command INIT to the processing control circuit 1300. In addition, the command/address decoder 1100 may transmit a first address signal A1 as an internal address I_ADDR to the memory control circuit 1400. As described with reference to FIG. 35, a counting operation may be performed in the processing control circuit 1300 that has received the internal initiation command INIT, and a counting value CNT may be generated as a result of the counting operation. At a second point in time "T2", the counting circuit 1330 of the processing control circuit 1300 may generate '1' as a counting value to output the counting value '1' to the MAC control signal generating circuit 1340. The MAC control signal generating circuit 1340 that has received the counting value '1' may output an internal MAC signal I_MAC of a logic "high" level at a third point in time "T3" after a predetermined time has elapsed from the second point in time "T2". As described with reference to FIG. 31, the internal MAC signal I_MAC of the logic "high" level may be transmitted to the memory control circuit 1400, the processing circuit 1600, and the I/O circuit 1700. As described with reference to FIG. 36, when the internal MAC signal I_MAC of the logic "high" level is received, the command blocking circuit 1420 of the memory control circuit 1400 may block a transmission of the first internal command I_CMD11 from the command/address decoder 1100 to the memory control signal generating circuit 1430. In addition, when a second MAC control signal MAC_CTL12 is transmitted from the processing control circuit 1300, the memory control signal generating circuit 1430 may generate a memory control signal MEM_CTL that corresponds to the second MAC control signal MAC_CTL12.

At a fourth point in time "T4", when the counting circuit 1330 finishes outputting a counting value CNT '2', the MAC control signal generating circuit 1340 may generate and transmit a MAC active control signal MAC_ACT of a logic "high" level to the memory control circuit 1400. The memory control circuit 1400 may generate and transmit a memory active control signal MEM_ACT that corresponds to the MAC active control signal MAC_ACT to the memory circuit 1500. The memory circuit 1500 may perform an activation operation on a selected row in response to the memory active control signal MEM_ACT. Although omitted in this example, before the MAC active control signal MAC_ACT of the logic "high" level is generated, the MAC control signal generating circuit 1340 may first generate and transmit a MAC pre-charge control signal of a logic "high" level to the memory control circuit 1400.

At a fifth point in time "T5", when the counting circuit 1330 finishes outputting a counting value CNT '4', the MAC control signal generating circuit 1340 may generate and transmit a first pulse of a MAC read control signal MAC_RD to the memory control circuit 1400. In addition, at the fifth point in time "T5", the MAC control signal generating circuit 1340 may generate and transmit a first pulse of a MAC operation control signal MAC_OP to the processing circuit 160. The memory control circuit 1400 may transmit a memory read control signal MEM_RD to the memory circuit 1500 in response to the internal MAC signal I_MAC of the logic "high" level and the first pulse of the MAC read control signal MAC_RD. The memory circuit 1500 may transmit first arithmetic data (first group of weight data and first group of vector data) to be used for a first MAC arithmetic operation to the processing circuit 1600 in response to the memory read control signal MEM_RD. The first arithmetic data may be designated by a start address ADDR_START and an end address ADDR_END that are transmitted from the information storage 1200. For example, when the MAC arithmetic operation is repeatedly performed four times as in this example, and first to fourth addresses are disposed between the start address ADDR_START and the end address ADDR_END, the first arithmetic data may be designated by the first address. The processing circuit 1600 may perform the first MAC arithmetic operation by using the first arithmetic data that are transmitted from the memory circuit 1500 in response to the MAC operation control signal MAC_OP of the logic "high" level.

At a sixth point in time "T6", when the counting circuit 1330 finishes outputting a counting value CNT '6', the MAC control signal generating circuit 1340 may generate and transmit a second pulse of the MAC read control signal MAC_RD to the memory control circuit 1400. In addition, at the sixth point in time "T6", the MAC control signal generating circuit 1340 may generate and transmit a second pulse of the MAC operation control signal MAC_OP to the processing circuit 1600. The memory control circuit 1400 may transmit the memory read control signal MEM_RD to the memory circuit 1500 in response to the internal MAC signal I_MAC of the logic "high" level and the second pulse of the MAC read control signal MAC_RD. The memory circuit 1500 may transmit second arithmetic data (i.e., second group of the weight data and second group of the vector data) to be used for a second MAC arithmetic operation to the processing circuit 1600 in response to the memory read control signal MEM_RD. The second arithmetic data may be designated by the second address between the start address ADDR_START and the end address ADDR_END. The processing circuit 1600 may perform the second MAC arithmetic operation by using the second arithmetic data that are transmitted from the memory circuit 1500 in response to the MAC operation control signal MAC_OP of the logic "high" level.

At a seventh point in time "T7", when the counting circuit 1330 finishes outputting a counting value CNT '8', the MAC control signal generating circuit 1340 may generate and transmit a third pulse of the MAC read control signal MAC_RD to the memory control circuit 1400. In addition, at the seventh point in time "T7", the MAC control signal generating circuit 1340 may generate and transmit a third pulse of the MAC operation control signal MAC_OP to the processing circuit 1600. The memory control circuit 1400 may transmit the memory read control signal MEM_RD to the memory circuit 1500 in response to the internal MAC signal I_MAC of the logic "high" level and the third pulse of the MAC read control signal MAC_RD. The memory circuit 1500 may transmit third arithmetic data (i.e., third group of the weight data and third group of the vector data) to be used for a third MAC arithmetic operation to the processing circuit 1600 in response to the memory read control signal MEM_RD. The third arithmetic data may be designated by the third address between the start address ADDR_START and the end address ADDR_END that are transmitted from the information store 1200. The processing circuit 1600 may perform the third MAC arithmetic operation by using the third arithmetic data that are transmitted from the memory circuit 1500 in response to the MAC operation control signal MAC_OP of the logic "high" level.

At an eighth point in time "T8", when the counting circuit 1330 finishes outputting a counting value '10', the MAC control signal generating circuit 1340 may generate and transmit a fourth pulse of the MAC read control signal MAC_RD to the memory control circuit 1400. In addition, at the eighth point in time "T8", the MAC control signal generating circuit 1340 may generate and transmit a fourth pulse of the MAC operation control signal MAC_OP to the processing circuit 1600. The memory control circuit 1400 may transmit the memory read control signal MEM_RD to the memory circuit 1500 in response to the internal MAC signal I_MAC of the logic "high" level and the fourth pulse of the MAC read control signal MAC_RD. The memory circuit 1500 may transmit fourth arithmetic data (i.e., fourth group of the weight data and fourth group of the vector data) to be used for the fourth MAC arithmetic operation to the processing circuit 1600 in response to the memory read control signal MEM_RD. The fourth arithmetic data may be designated by the fourth address between the start address ADDR_START and the end address ADDR_END that are transmitted from the information storage 1200. The processing circuit 1600 may perform the fourth MAC arithmetic operation by using the fourth arithmetic data that are transmitted from the memory circuit 1500 in response to the MAC operation control signal MAC_OP of the logic "high" level. As the MAC arithmetic operations are performed on the arithmetic data corresponding to all addresses between the start address ADDR_START and the end address ADDR_END, the MAC control signal generating circuit 1340 of the processing control circuit 1300 may no longer generate the pulses of the MAC read control signal MAC_RD and the MAC operation control signal MAC_OP.

At a ninth point in time "T9", after the counting circuit 1330 outputs a counting value CNT '13', the MAC control signal generating circuit 1340 of the processing control circuit 1300 may generate and transmit a MAC end signal I_END of a logic "high" level to the first latch circuit 1311 and the second latch circuit 1312 of the processing control circuit 1300. Accordingly, the counting circuit 1330 may no longer perform a counting operation. At a tenth point in time "T10", when the counting value CNT is not output from the counting circuit 1330, the MAC control signal generating circuit 1340 may change the logic level of the internal MAC signal I_MAC from a logic "high" level to a logic "low" level. As the logic level of the internal MAC signal I_MAC is changed to the logic "low" level, the memory control signal generating circuit 1430 of the memory control circuit 1400 may stop generating the memory control signal for the internal MAC arithmetic operation and may generate a memory control signal corresponding to the first internal command I_CMD11.

Figure 38:
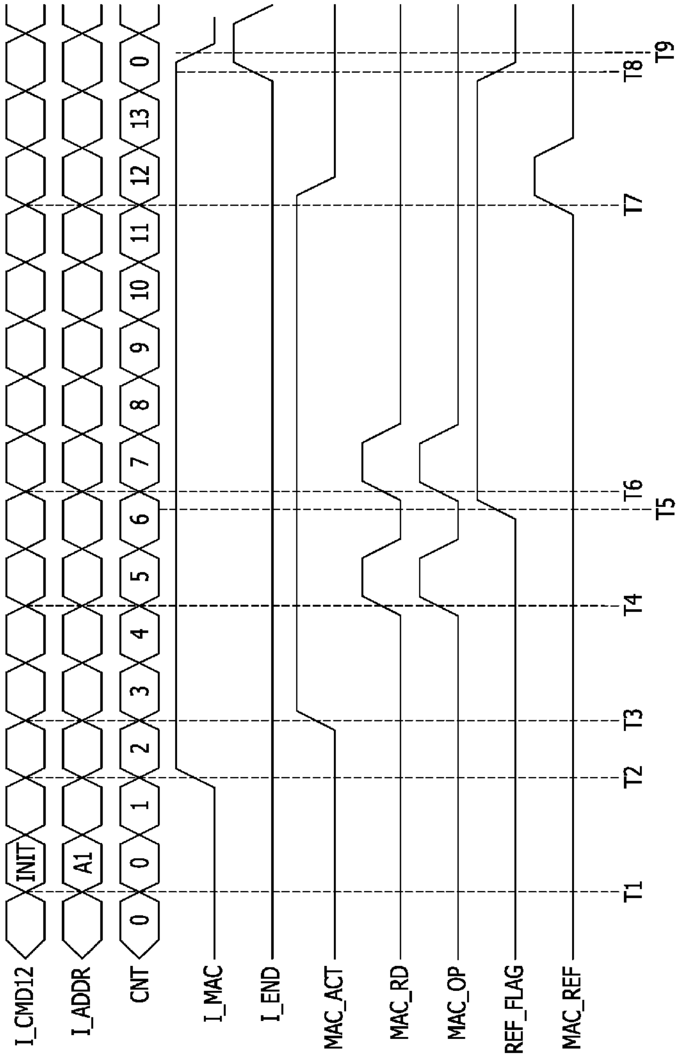
FIG. 38 is a timing diagram illustrating another example of the internal MAC arithmetic operation of the PIM device of FIG. 31.

FIG. 38 is a timing diagram illustrating another example of an internal MAC arithmetic operation of the PIM device 1000 of FIG. 31. In this example, it is assumed that an external refresh command REF_ECMD is transmitted from a host device while the PIM device 1000 is performing an internal MAC arithmetic operation. Referring to FIG. 38, when the external MAC command MAC_ECMD is transmitted to the command/address decoder 1100 from the host device, at a first point in time "T1", the command/address decoder 1100 may generate and transmit an internal initiation command INIT to the processing control circuit 1300. In addition, the command/address decoder 1100 may transmit a first address signal A1 as an internal address I_ADDR to the memory control circuit 1400. As described with reference to FIG. 35, in the processing control circuit 1300 that has received the internal initiation command INIT, a counting operation may be performed, and a counting value CNT may be generated as a result of the counting operation. At a second point in time "T2", the counting circuit 1330 of the processing control circuit 1300 may generate and transmit '1' as the counting value CNT to the MAC control signal generating circuit 1340. The MAC control signal generating circuit 1340 that has received the counting value '1' may output an internal MAC signal I_MAC of a logic "high" level at a third point in time "T3" after a predetermined time has elapsed from the second point in time "T2". As described with reference to FIG. 31, the internal MAC signal I_MAC of the logic "high" level may be transmitted to the memory control circuit 1400, the processing circuit 1600, and the I/O circuit 1700. As described with reference to FIG. 36, when the internal MAC signal I_MAC of the logic "high" level is received, the command blocking circuit 1420 of the memory control circuit 1400 may block a transmission of the first internal command I_CMD11 from the command/address decoder 1100 to the memory control signal generation circuit 1430. In addition, when a second MAC control signal MAC_CTL12 is transmitted from the processing control circuit 1300, the memory control signal generating circuit 1430 may generate a memory control signal MEM_CTL that corresponds to the second MAC control signal MAC_CTL12.

At a third point in time "T3", when the counting circuit 1330 of the processing circuit 1300 finishes outputting a counting value CNT '2', the MAC control signal generating circuit 1340 may generate and transmit a MAC active control signal MAC_ACT of a logic "high" level to the memory control circuit 1400. The memory control circuit 1400 may generate and transmit a memory active control signal MEM_ACT that corresponds to the MAC active control signal MAC_ACT to the memory circuit 1500. The memory circuit 1500 may perform an activation operation on a selected row in response to the memory active control signal MEM_ACT. Although omitted in this example, before the MAC active control signal MAC_ACT of the logic "high" level is generated, the MAC control signal generating circuit 1340 may first generate and transmit a MAC pre-charge control signal of a logic "high" level to the memory control circuit 1400.

At a fourth point in time "T4", when the counting circuit 1330 finishes the output of the counting value CNT '4', the MAC control signal generation circuit 1340 may generate and transmit a first pulse of the MAC read control signal MAC_RD to the memory control circuit 1400. In addition, at the fourth point in time "T4", the MAC control signal generation circuit 1340 may generate and transmit a first pulse of the MAC operation control signal MAC_OP to the operation circuit 1600. The memory control circuit 1400 may transmit the memory read control signal MEM_RD to the memory circuit 1500 in response to the first pulse of the high-level internal MAC signal I_MAC and the MAC read control signal MAC_RD. The memory circuit 1500 may transmit the first arithmetic data (i.e., first group of weight data and first group of vector data) to be used for the first MAC arithmetic operation to the operation circuit 1600 in response to the memory read control signal MEM_RD. The first arithmetic data may be designated by the start address ADDR_START and the end address ADDR_END that are transmitted from the information storage 1200. For example, as in this example, when the MAC arithmetic operation is repeatedly performed twice and the first and second addresses are disposed between the start address ADDR_START and the end address ADDR_END, the first arithmetic data may be designated by the first address. The operation circuit 1600 may perform the first MAC arithmetic operation by using the first arithmetic data that are transmitted from the memory circuit 1500 in response to the high-level MAC operation control signal MAC_OP.

At a sixth point in time "T6" when the counting circuit 1330 of the processing circuit 1300 finishes outputting the counting value CNT '6', the MAC control signal generating circuit 1340 may generate and transmit a second pulse of the MAC read control signal MAC_RD to the memory control circuit 1400. In addition, at the sixth point in time "T6", the MAC control signal generating circuit 1340 may generate and transmit a second pulse of the MAC operation control signal MAC_OP to the processing circuit 1600. The memory control circuit 1400 may transmit the memory read control signal MEM_RD to the memory circuit in response to the internal MAC signal I_MAC of the logic "high" level and the second pulse of the MAC read control signal MAC_RD. The memory circuit 1500 may transmit second arithmetic data (i.e., second group of the weight data and second group of the vector data) to be used for the second MAC arithmetic operation to the processing circuit 1600 in response to the memory read control signal MEM_RD. The second arithmetic data may be designated by the second address between the start address ADDR_START and the end address ADDR_END that are transmitted from the information storage 1200. The processing circuit 1600 may perform the second MAC arithmetic operation by using the second arithmetic data that are transmitted from the memory circuit 1500 in response to the MAC operation control signal MAC_OP of the logic "high" level. As the MAC arithmetic operations are performed on the arithmetic data corresponding to all addresses (i.e., first and second addresses) between the start address ADDR_START and the end address ADDR_END, the MAC control signal generating circuit 1340 of the processing control circuit 1300 may no longer generate the pulses of the MAC read control signal MAC_RD and the MAC operation control signal MAC_OP.

When the external refresh command REF_ECMD is transmitted from the host device while the MAC arithmetic operation is being performed, for example, before the fifth point in time "T5" between the fourth point in time "T4" and the sixth point in time "T6", the command/address decoder 1100 may generate and transmit an internal refresh command I_REF to the processing control circuit 1300 and the memory control circuit 1400. The second latch circuit 1312 of the processing control circuit 1300 may change the logic level of a refresh flag signal REF_FLAG from a logic "low" level to a logic "high" level at the fifth point in time "T5". When the refresh flag signal REF_FLAG of a logic "high" level is received, the MAC control signal generating circuit 1340 of the processing control circuit 1300 may generate and transmit a pulse of the MAC refresh control signal MAC_REF at a seventh point in time "T7" after a predetermined time has elapsed from the fifth point in time "T5" to the memory control circuit 1400. The seventh point in time "T7" may be set to a point in time after all MAC arithmetic operations are finished. The memory control circuit 1400 may generate a memory refresh control signal MEM_REF in response to the pulse of the MAC refresh control signal MAC_REF and transmit the generated memory refresh control signal MEM_REF to the memory circuit 1500. The memory circuit 1500 may perform a refresh operation in response to the memory refresh control signal MEM_REF.

At the point in time at which the processing control circuit 1300 outputs the pulse of the MAC refresh control signal MAC_REF, that is, at an eighth point in time "T8" after the seventh point in time "T7", the MAC control signal generating circuit 1340 of the processing control circuit 1300 may generate and transmit a MAC end signal I_END of a logic "high" level to the first latch circuit 1311 and the second latch circuit 1312 of the processing control circuit 1300. Accordingly, the counting circuit 1330 may no longer perform a counting operation. At a ninth point in time "T9" when the counting value CNT is not output from the counting circuit 1330, the MAC control signal generating circuit 1340 may change the logic level of the internal MAC signal I_MAC from a logic "high" level to a logic "low" level. As the logic level of the internal MAC signal I_MAC is changed to the logic "low" level, the memory control signal generating circuit 1430 of the memory control circuit 1400 may stop generating the memory control signal for the internal MAC arithmetic operation and may generate a memory control signal that corresponds to the first internal command I_CMD11.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:

a memory circuit configured to provide arithmetic data;

a processing circuit configured to perform an arithmetic operation by using arithmetic data from the memory circuit;

an information storage configured to store arithmetic operation information that defines the arithmetic operation;

a processing control circuit configured to generate a first arithmetic control signal and a second arithmetic control signal based on the arithmetic operation information from the information storage and an internal initiation command; and a memory control circuit configured to generate a memory control signal based on the second arithmetic control signal and configured to transmit the memory control signal to the memory circuit.

2. The PIM device of claim 1, further comprising an input/output circuit for communication with a host device, wherein the memory circuit is configured to transmit data to the input/output circuit or receive data from the input/output circuit based on the memory control signal.

3. The PIM device of claim 1, further comprising a command/address decoder configured to receive an external command and an external address from a host device to generate and output a first internal command or a second internal command, and an internal address.

4. The PIM device of claim 3, wherein the command/address decoder is configured to:

generate the first internal command to transmit the first internal command to the memory control circuit when one of an external read command and an external write command is transmitted from the host device as the external command, and generate the second internal command to transmit the second internal command to the processing control circuit when an external arithmetic command is transmitted from the host device as the external command.

5. The PIM device of claim 4, wherein the first internal command includes an internal read command and an internal write command, and wherein the second internal command includes the internal initiation command.

6. The PIM device of claim 4, wherein, when an external refresh command is transmitted from the host device as the external command, the command/address decoder is configured to generate an internal refresh command as the first internal command and the second internal command to transmit the internal refresh command to the processing control circuit and the memory control circuit.

7. The PIM device of claim 4, wherein, when a mode register setting command is transmitted from the host device as the external command, the command/address decoder is configured to generate an arithmetic information storage command as the second internal command to transmit the arithmetic information storage command to the information storage.

8. The PIM device of claim 7, wherein, when the mode register setting command is transmitted from the host device as the external command, the command/address decoder is configured to extract the arithmetic operation information from the external address to transmit the arithmetic operation information to the information storage.

9. The PIM device of claim 4, wherein the information storage is configured to transmit the arithmetic operation information to the processing control circuit in synchronization with a generation time of the second internal command.

10. The PIM device of claim 1, wherein the arithmetic operation information includes command type that defines the first arithmetic control signal and the second arithmetic control signal necessary for performing operations in the memory circuit and the processing circuit, timing that designates generation times of the first arithmetic control signal and the second arithmetic control signal that are designated by the command type, and a start address and an end address that designate a storage location of the arithmetic data in the memory circuit.

11. The PIM device of claim 1, further comprising a command/address decoder configured to receive an external command and an external address from a host device to generate and output a first internal command or a second internal command, and an internal address, wherein the processing control circuit is configured to:

generate an internal arithmetic signal indicating an enable state of an internal arithmetic mode, the first arithmetic control signal, and the second arithmetic control signal in response to the internal initiation command that is transmitted from the command/address decoder as the second internal command, and transmit the internal arithmetic signal to the processing circuit and the memory control circuit, transmit the first arithmetic control signal to the processing circuit, and transmit the second arithmetic control signal to the memory control circuit.

12. PIM device of claim 11, wherein the processing control circuit is configured to generate an arithmetic control signal that controls the arithmetic operation in the processing circuit to transmit the arithmetic control signal to the processing circuit as the first arithmetic control signal.

13. The PIM device of claim 11, wherein the processing control circuit is configured to generate an arithmetic active function control signal that controls an active function application operation in the processing circuit to transmit the arithmetic active function control signal to the processing circuit as the first arithmetic control signal.

14. The PIM device of claim 11, wherein the processing control circuit is configured to generate an arithmetic read control signal that controls an operation of providing the arithmetic data from the memory circuit to the processing circuit to transmit the arithmetic read control signal to the memory control circuit as the second arithmetic control signal.

15. The PIM device of claim 11, wherein the processing control circuit includes:

a first latch circuit configured to latch the internal initiation command and output an output signal that corresponds to the latched internal initiation command;

an internal clock generating circuit configured to generate and output an internal clock signal in response to the output signal of the first latch circuit;

a counting circuit configured to perform a counting operation in synchronization with the internal clock signal of the internal clock generating circuit and configured to output a counting value that is generated by the counting operation; and an arithmetic control signal generating circuit configured to receive the counting value and the arithmetic operation information and configured to generate and output the internal arithmetic signal, the first arithmetic control signal, and the second arithmetic control signal according to the counting value.

16. The PIM device of claim 15, wherein the processing control circuit further includes a second latch circuit configured to receive and latch an internal refresh command and configured to transmit a refresh flag signal, corresponding to the latched internal refresh command, to the processing control signal generating circuit.

17. The PIM device of claim 16, wherein, when the counting value corresponds to a first counting value, the arithmetic control signal generating circuit is configured to output the internal arithmetic signal of a first logic level.

18. The PIM device of claim 17, wherein, when the counting value corresponds to a second counting value that is greater than the first counting value, the arithmetic control signal generating circuit is configured to output an arithmetic pre-charge control signal of the first logic level as the second arithmetic control signal.

19. The PIM device of claim 18, wherein, when the counting value corresponds to a third counting value that is greater than the second counting value, the arithmetic control signal generating circuit is configured to output an arithmetic active control signal of the first logic level as the second arithmetic control signal.

20. The PIM device of claim 19, wherein, when the counting value corresponds to a fourth counting value that is greater than the third counting value, the arithmetic control signal generating circuit is configured to output an arithmetic control signal having a plurality of pulses as the first arithmetic control signal and configured to output an arithmetic read control signal having a plurality of pulses as the second arithmetic control signal.

21. The PIM device of claim 20, wherein the first to fourth counting values are determined by the arithmetic operation information that is provided from the information storage.

22. The PIM device of claim 20, wherein, when the refresh flag signal is transmitted from the second latch circuit, the arithmetic control signal generating circuit is configured to generate and output a pulse of an arithmetic refresh control signal as the first arithmetic control signal after outputting the arithmetic control signal having the plurality of pulses.

23. The PIM device of claim 11, wherein the memory control circuit includes:

a command blocking circuit configured to block the first internal command based on a logic level of the internal arithmetic signal; and a memory control signal generating circuit configured to generate and output a memory control signal that corresponds to the first internal command or the second internal command based on a logic level of the internal arithmetic signal.

24. The PIM device of claim 23, wherein the memory control signal generating circuit receives the internal arithmetic signal, wherein the command blocking circuit receives an inverted internal arithmetic signal in which a logic level of the internal arithmetic signal is inverted, wherein the command blocking circuit includes an AND gate having a first input terminal, a second input terminal, and an output terminal, wherein the AND gate receives the first internal command through the first input terminal and receives the inverted internal arithmetic signal through the second input terminal, and wherein the output terminal is coupled to the memory control signal generating circuit.

25. The PIM device of claim 11, further comprising an input/output circuit for communication with a host device, wherein the processing control circuit is configured to transmit the internal arithmetic signal to the host device through the input/output circuit.

* * * * *